US011243273B2

(12) United States Patent
Cibula et al.

(10) Patent No.: US 11,243,273 B2
(45) Date of Patent: Feb. 8, 2022

(54) ESTIMATION OR CONTROL OF LENGTHS AND POSITIONS OF ONE OR MORE TRANSVERSELY LOCALIZED ELECTRIC CURRENT SEGMENTS FLOWING BETWEEN TWO CONDUCTIVE BODIES

(71) Applicant: KW Associates LLC, Albany, OR (US)

(72) Inventors: Matthew A. Cibula, Salem, OR (US); Paul E. King, Albany, OR (US); Joshua R. Motley, Corvallis, OR (US); Nathan L. Pettinger, Corvallis, OR (US)

(73) Assignee: KW ASSOCIATES LLC, Albany, OR (US)

( * ) Notice: Subject to any disclaimer, the term of this patent is extended or adjusted under 35 U.S.C. 154(b) by 0 days.

(21) Appl. No.: 17/200,875

(22) Filed: Mar. 14, 2021

(65) Prior Publication Data

US 2021/0286024 A1 Sep. 16, 2021

Related U.S. Application Data

(60) Provisional application No. 62/990,436, filed on Mar. 16, 2020.

(51) Int. Cl.
*G01R 33/10* (2006.01)
*G01R 33/06* (2006.01)
*G01R 33/00* (2006.01)

(52) U.S. Cl.
CPC ......... *G01R 33/06* (2013.01); *G01R 33/0064* (2013.01); *G01R 33/10* (2013.01)

(58) Field of Classification Search
CPC .... G01R 33/0064; G01R 33/00; G01R 33/06; G01R 33/10; G01R 33/0035;
(Continued)

(56) References Cited

U.S. PATENT DOCUMENTS 2,727,936 A 12/1955 Boyer
2,727,937 A 12/1955 Boyer
(Continued)

FOREIGN PATENT DOCUMENTS

JP S60-77939 5/1985
JP S60-077939 5/1985
(Continued)

OTHER PUBLICATIONS

Ward et al; Ensemble Arc Motion & Solidification During the Vacuum Arc Remelting of a Nickel-based Superalloy; Int'l Symp on Liquid Metal Processing & Casting; p. 49 (2005); cited in parent.
(Continued)

*Primary Examiner* — Jermele M Hollington
*Assistant Examiner* — Taqi R Nasir
(74) *Attorney, Agent, or Firm* — David S. Alavi

(57) ABSTRACT

Magnetic field components are measured at multiple longitudinal positions and used to calculate estimated longitudinal position and length of a transversely localized electric current segment flowing across a gap between conductive bodies. The apparatus can be used with a remelting furnace. The electrode and ingot act as the conductive bodies, and arcs, discharges, or slag currents are the current segments spanning the gap. Actuators for movable sensors can be coupled to the sensors in a servomechanism arrangement to move the sensors along with the moving gap. An actuator for moving one of the conductive bodies can be coupled to sensors in a servomechanism arrangement to maintain the gap distance within a selected range as the gap moves.

23 Claims, 22 Drawing Sheets

(58) Field of Classification Search
CPC ............ G01R 33/0023; G01R 33/0017; G01R 31/3191; G01B 7/004; G01C 17/38; G06F 3/017; G06F 3/0346; G06F 3/012

See application file for complete search history.

(56) References Cited

U.S. PATENT DOCUMENTS

| | | | |
|---|---|---|---|
| 2,951,890 A | 9/1960 | Yeomans et al. | |
| 2,972,695 A | 2/1961 | Wroe | |
| 2,978,525 A | 4/1961 | Gruber et al. | |
| 3,398,229 A | 8/1968 | De Corso | |
| 3,546,348 A | 12/1970 | De Corso | |
| 3,566,143 A | 2/1971 | Paine et al. | |
| 3,609,522 A | 9/1971 | Hutchins et al. | |
| 3,628,948 A | 12/1971 | Bruning | |
| 3,629,694 A | 12/1971 | Hearn | |
| 3,680,163 A | 8/1972 | De Corso | |
| 3,708,279 A | 1/1973 | De Corso | |
| 4,122,292 A | 10/1978 | Karinsky | |
| 4,495,625 A | 1/1985 | Heberlein et al. | |
| 4,581,745 A | 4/1986 | Mathews et al. | |
| 4,762,165 A | 8/1988 | Ogino | |
| 5,206,596 A | 4/1993 | Beihoff et al. | |
| 5,373,529 A | 12/1994 | Zanner et al. | |
| 6,605,936 B1 * | 8/2003 | Tamai .................. | G01R 15/202 324/117 R |
| 7,821,253 B2 * | 10/2010 | Serpinet ............... | G01R 15/207 324/117 R |
| 8,111,059 B1 * | 2/2012 | King .................. | G01R 19/0092 324/117 R |
| 10,514,413 B2 | 12/2019 | Cibula et al. | |
| 10,761,116 B2 | 9/2020 | Cibula et al. | |
| 2006/0012369 A1 | 1/2006 | Neufeld et al. | |
| 2006/0273263 A1 | 12/2006 | Raymond et al. | |
| 2011/0221437 A1 | 9/2011 | Stockum | |
| 2013/0092208 A1 | 4/2013 | Robbins | |
| 2013/0226479 A1 | 8/2013 | Grosjean | |
| 2014/0015520 A1 | 1/2014 | Kunjappan et al. | |
| 2015/0048818 A1 | 2/2015 | Schaffer et al. | |
| 2016/0131790 A1 | 5/2016 | Vowles | |
| 2016/0146909 A1 | 5/2016 | Kawabata et al. | |
| 2016/0161570 A1 | 6/2016 | Gohara et al. | |
| 2016/0252599 A1 | 9/2016 | Motz et al. | |
| 2019/0219615 A1 | 7/2019 | Cibula et al. | |
| 2020/0241078 A1 | 7/2020 | Cibula et al. | |
| 2020/0355731 A1 | 11/2020 | Cibula et al. | |

FOREIGN PATENT DOCUMENTS

| | | |
|---|---|---|
| JP | H03-274382 | 12/1991 |
| JP | 2002-340320 | 11/2002 |
| JP | 2014-052144 | 3/2014 |
| RU | 2516325 | 5/2014 |

OTHER PUBLICATIONS

Zanner et al; On the Origin of Defects in VAR ingots; International Symposium on Liquid Metal Processing and Casting, Santa Fe, NM, USA, p. 13 (2005); cited in parent.

Zanner et al; Observations of melt rate as a function of . . . during vacuum consumable arc remelting of . . . ; Metallurgical & Materials Transactions B v15 p. 117 (1984); cited In parent.

Woodside; Investigating arc behavior in a DC vacuum arc remelting furnace using magnetic flux density measurements; masters thesis, Oregon State University; (2008); cited in parent.

Woodside; Arc Distribution and Motion During the Vacuum Arc Remelting Process As Detected with a Magnetostatic Approach; PhD dissertation, Oregon State University (2010); cited in parent.

Woodside et al; A Measurement System for Determining the Positions of Arcs During Vacuum Arc Remelting; IEEE Int'l Instrumentation & Measurement Tech Conf; p. 452 (2010); cited in parent.

Woodside et al: Characterizing Arc Motion and Distribution During Vacuum Arc Remelting; nt'l Symp on Liquid Metal Processing & Casting; v75 (2009); cited in parent.

Woodside et al; Arc Distribution During the Vacuum Arc Remelting of Ti-6Al-4V; Metallurgical & Materials Transactions B v44 n1 p. 154 (2012): cited in parent.

Woodside; Arc Distribution and Motion During the Vacuum Arc Remelting Process As Detected with a Magnetostatic Approach; PhD dissertation, Oregon State University (2010).

Woodside et al; A Measurement System for Determining the Positions of Arcs During Vacuum Arc Remelting; IEEE Int'l Instrumentation & Measurement Tech Conf; p. 452 (2010).

International Search Report and Written Opinion dated Jun. 18, 2021 for counterpart App No. PCT/US2021/022264.

U.S. Appl. No. 17/334,611 entitled "Estimation of Arc Location in Three Dimensions" filed Mar. 28, 2021 in the names of Cibula et al; available in IFW.

\* cited by examiner

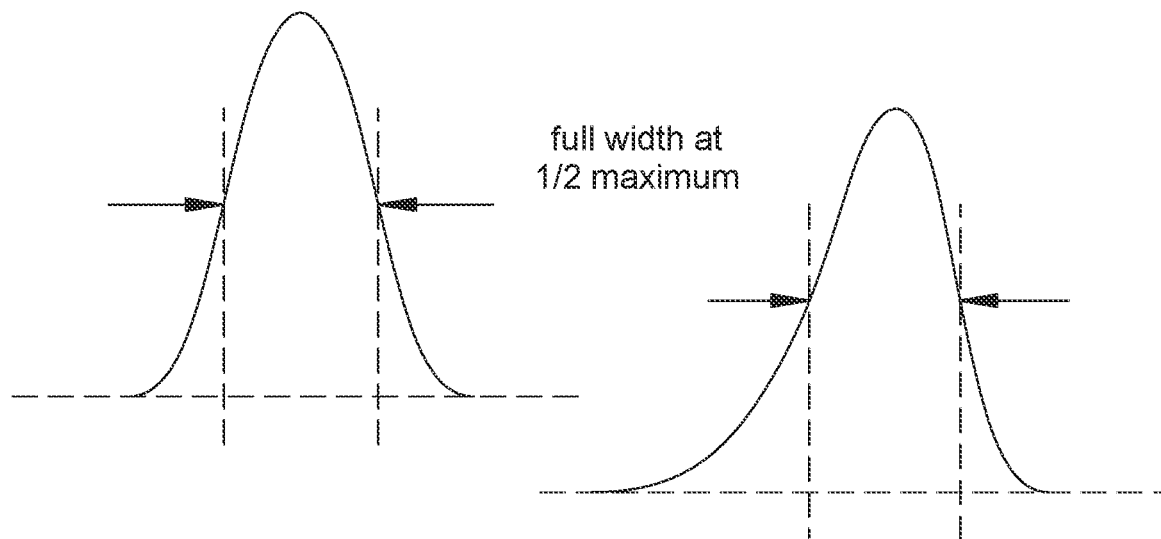
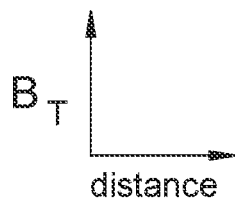
FIG. 8A
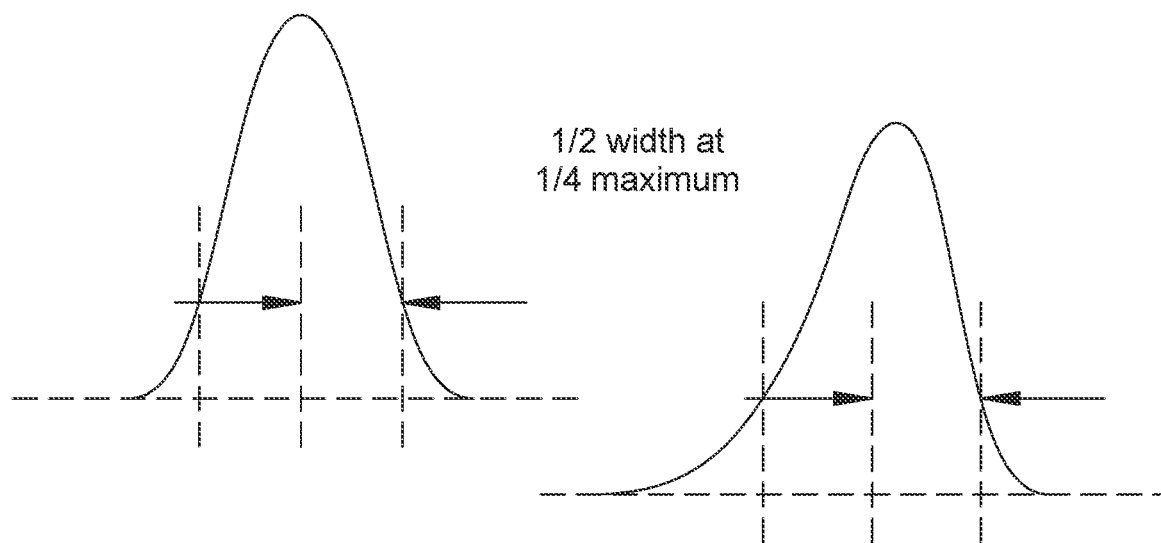

ESTIMATION OR CONTROL OF LENGTHS AND POSITIONS OF ONE OR MORE TRANSVERSELY LOCALIZED ELECTRIC CURRENT SEGMENTS FLOWING BETWEEN TWO CONDUCTIVE BODIES

BENEFIT CLAIM

This application claims benefit of U.S. provisional App. No. 62/990,436 entitled "Estimation or control of lengths and positions of one or more transversely localized electric current segments flowing between two conductive bodies" filed Mar. 16, 2020 in the names of inventors Matthew A. Cibula, Paul E. King, Joshua R. Motley, and Nathan L. Pettinger, said provisional application being hereby incorporated by reference as if set forth herein in its entirety.

FIELD OF THE INVENTION

The field of the present invention relates to estimation or control of a localized electric current segment. In particular, apparatus and methods are disclosed for estimating or controlling length(s) and position(s) of one or more transversely localized electric current segments flowing across a gap between two conductive bodies.

SUMMARY

An inventive apparatus is arranged for estimating corresponding length parameter(s) and longitudinal position(s) within a sensing volume of one or more transversely localized electric current segments. The inventive apparatus includes a computer system, one or more movable magnetic field sensors, and one or more sensor actuators. The computer system includes one or more electronic processors and one or more digital storage media coupled thereto. The one or more magnetic field sensors are movable longitudinally along a lateral periphery of a sensing volume through which an electric current flows in a generally longitudinal direction (i) through a first electrically conductive body at least partly within the sensing volume, (ii) through a second electrically conductive body at least partly within the sensing volume, and (iii) across a gap between the first and second conductive bodies as the one or more transversely localized electric current segments. The one or more sensor actuators are arranged so as to move the one or more movable sensors longitudinally along the sensing volume in response to sensor position control signals generated by and transmitted from the computer system. The computer system is operatively coupled to the one or more sensor actuators and to the one or more movable sensors, and receives from them signals indicative of, respectively, corresponding longitudinal positions of the one or more movable sensors along the sensing volume and the corresponding magnetic field components measured by the one or more movable sensors. The computer system also generates, and transmits to the one or more sensor actuators, the sensor position control signals. The computer system calculates corresponding estimated length parameter(s) and longitudinal position(s) of the one or more current segments. That calculation is based at least in part on (i) magnetic field components measured at multiple different longitudinal positions along the sensing volume and (ii) for each of those measured magnetic field components, a corresponding longitudinal position along the sensing volume at which that magnetic field component was measured by a corresponding one of the one or more movable sensors.

In various examples the current segment(s) can include electric discharge(s) or arc(s) formed across the gap between the first and second conductive bodies, transient short circuit(s) through droplet(s) of molten metal that drip across the gap between the first and second conductive bodies, localized current segment(s) that flow through a molten slag layer between the conductive bodies, or electric current flowing between the first and second conductive bodies through a conductive wire or rod. In some examples the movable sensors can be mounted on a movable platform. In various examples the movable sensors can be coupled in a servomechanism arrangement with the sensor actuators (for controlling position of the movable sensors), with a platform actuator (if present, for controlling position of the movable sensors), with a conductive member actuator (if present, for controlling width of the gap between the conductive members), or with magnetic field sources (if present). In some examples magnetic field sources can be employed for altering or controlling transverse position of the current segments; in some of those examples the current segment can be scanned transversely and the estimated length parameter of a current segment used to map transverse topography of the gap between the conductive members. In some examples the conductive bodies can be the electrode and ingot of a remelting furnace; in some of those examples the computer system can generate and store a profile of current segment estimated length parameter(s) as a function of melt time, and associate each such stored profile with the ingot formed by the corresponding remelting process; in some of those examples the stored profile can also include one or more of current segment estimated longitudinal or transverse position(s), electrode position, electrode weight, transverse topography of the gap, voltage across the gap, or total current. The stored profiles can be employed for facilitating subsequent quality control of the ingot.

Objects and advantages pertaining to sensing and controlling the length or position of a localized electrical current segment, such as an electric arc or other electrical discharge, may become apparent upon referring to the example embodiments illustrated in the drawings and disclosed in the following written description or appended claims.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

BRIEF DESCRIPTION OF THE DRAWINGS

FIG. 2A shows an arrangement earlier in a remelting process; FIG. 2B shows an arrangement later in a remelting process.

FIG. 3A shows an arrangement earlier in a remelting process; FIG. 3B shows an arrangement later in a remelting process.

FIG. 4A shows an arrangement earlier in a remelting process; FIG. 4B shows an arrangement later in a remelting process.

FIG. 5A shows an arrangement earlier in a remelting process; FIG. 5B shows an arrangement later in a remelting process.

FIG. 6A shows an arrangement earlier in a remelting process; FIG. 6B shows an arrangement later in a remelting process.

FIG. 7A shows an arrangement earlier in a remelting process; FIG. 7B shows an arrangement later in a remelting process.

FIGS. 8A through 8C illustrate several examples of functional dependence of a transverse magnetic field component on sensor longitudinal position across the gap, and example calculations of longitudinal position or length parameter of a current segment spanning the gap.

FIG. 10A shows an arrangement earlier in a remelting process; FIG. 10B shows an arrangement later in a remelting process.

Figure 1:
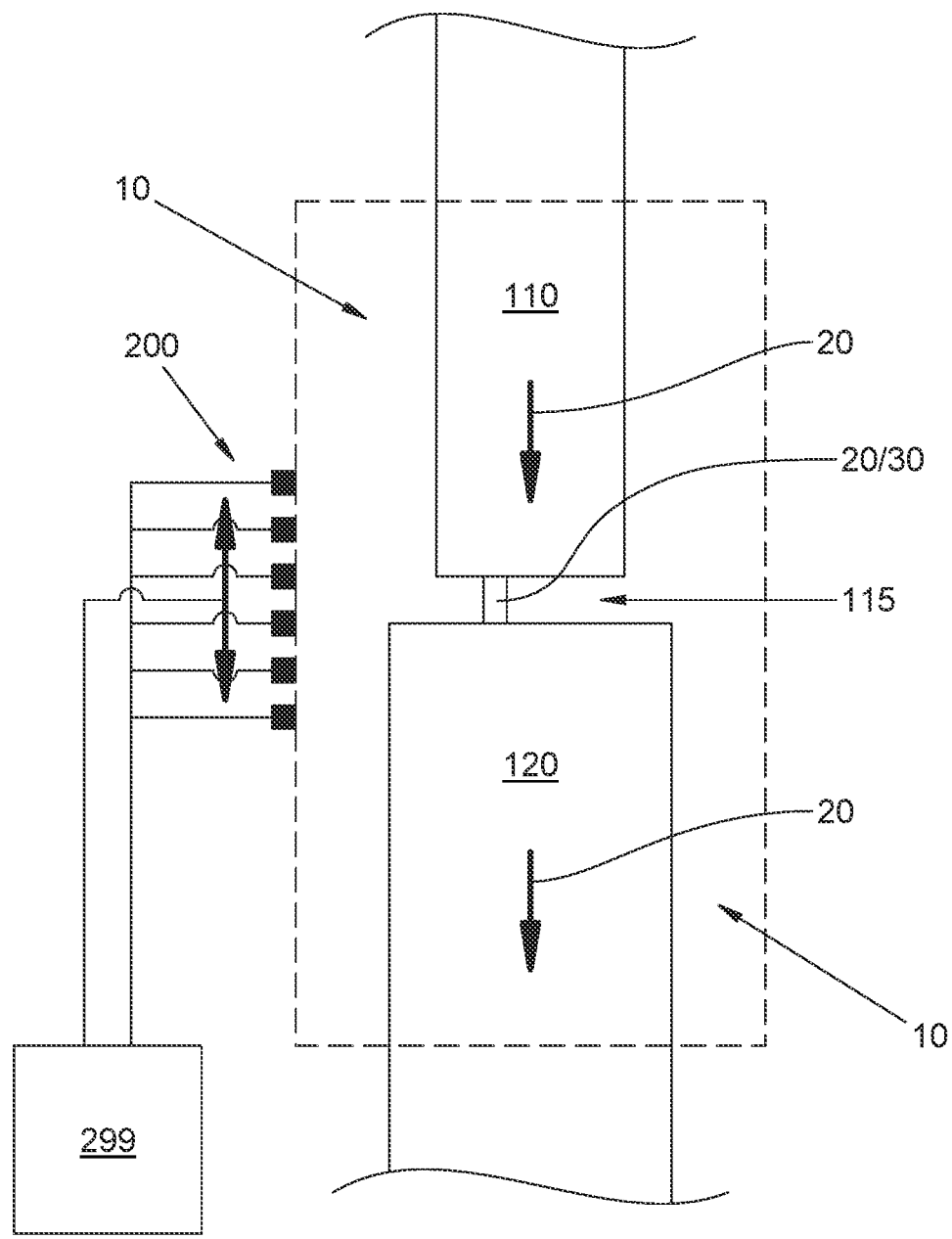
FIG. 1 is a schematic cross-sectional diagram of a general arrangement of an inventive apparatus.
Figure 2A:
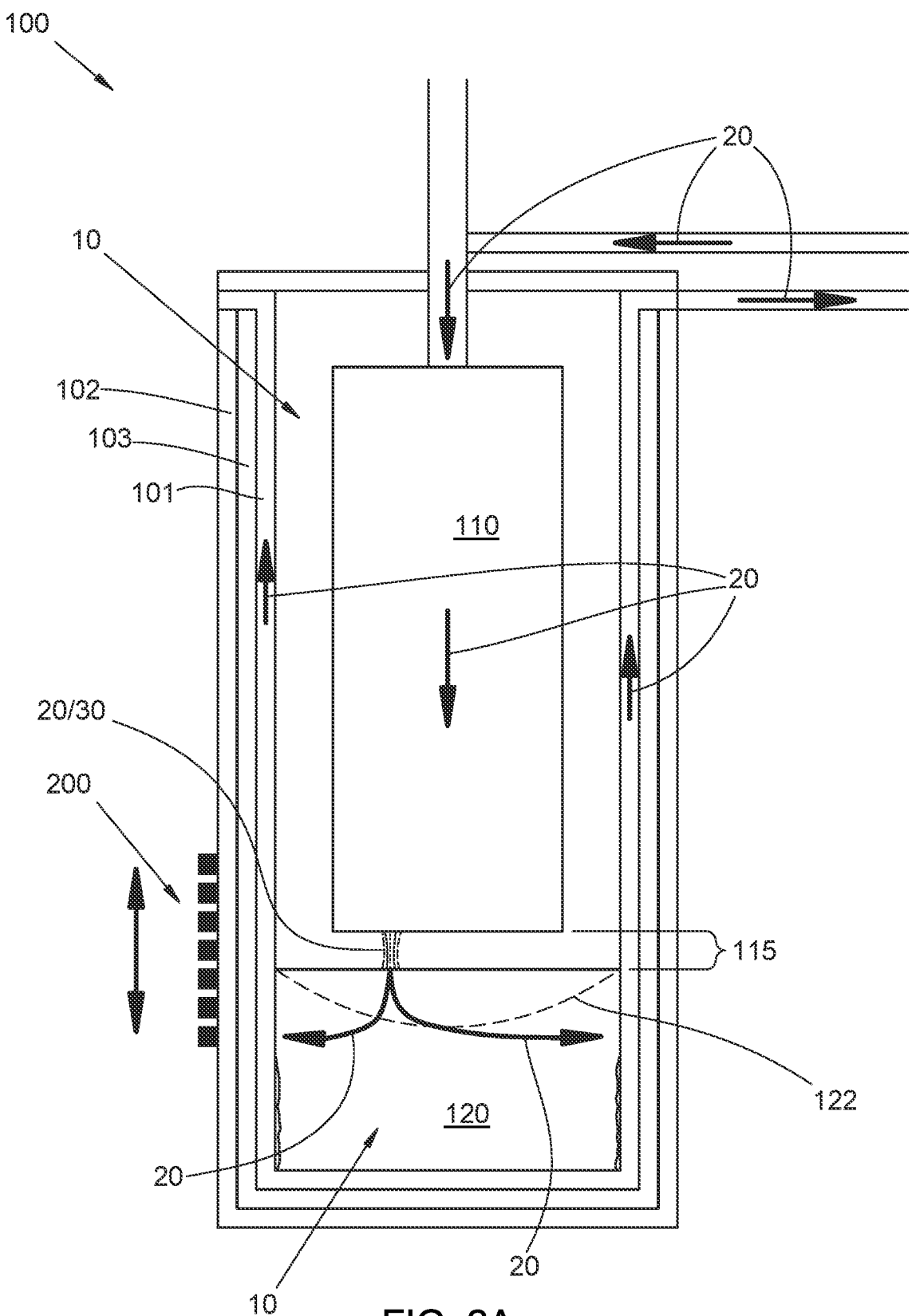
FIGS. 2A and 2B are schematic cross-sectional diagrams of an example of an inventive apparatus implemented in a remelting furnace.
Figure 2B:
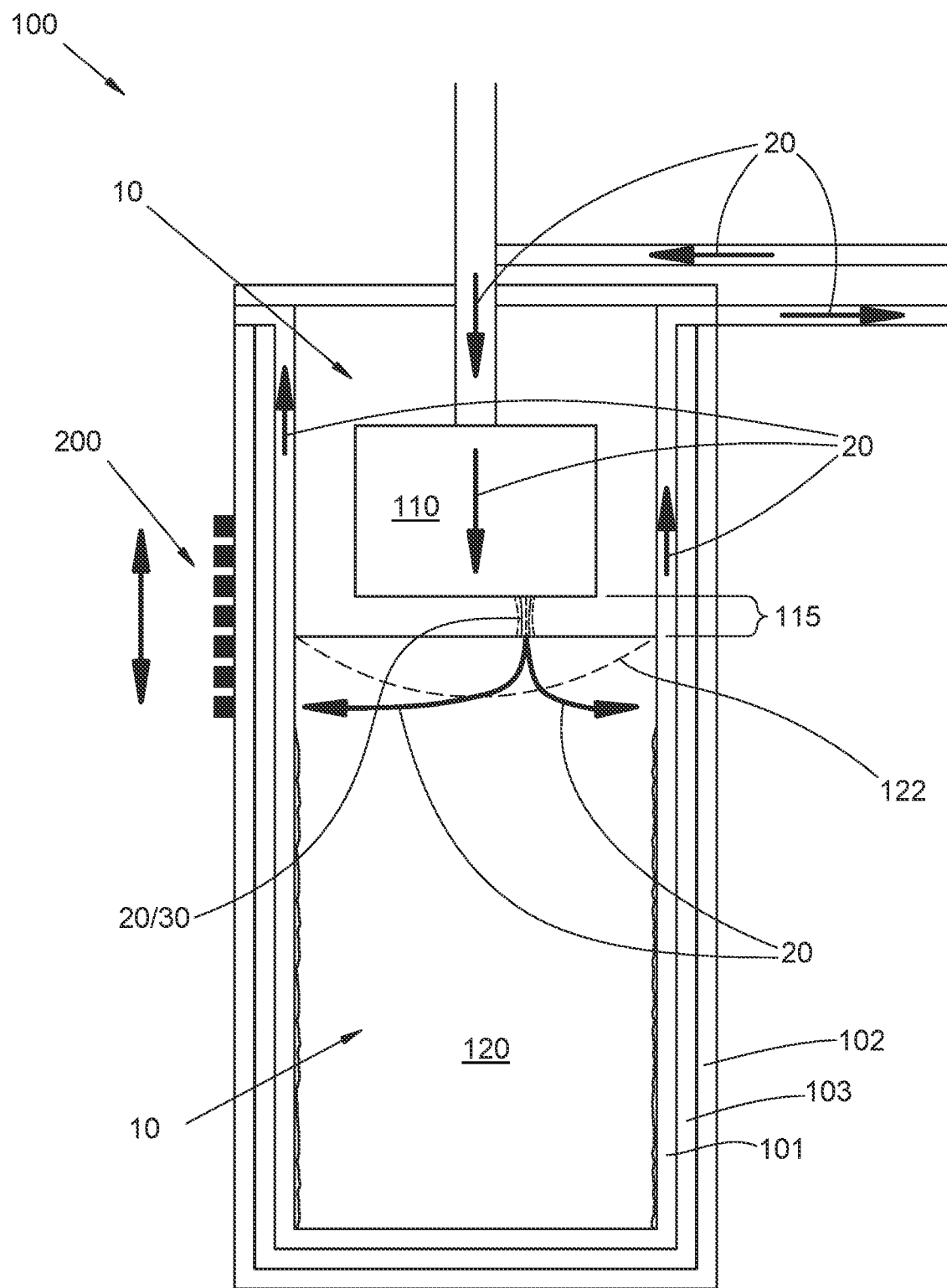
Figure 3A:
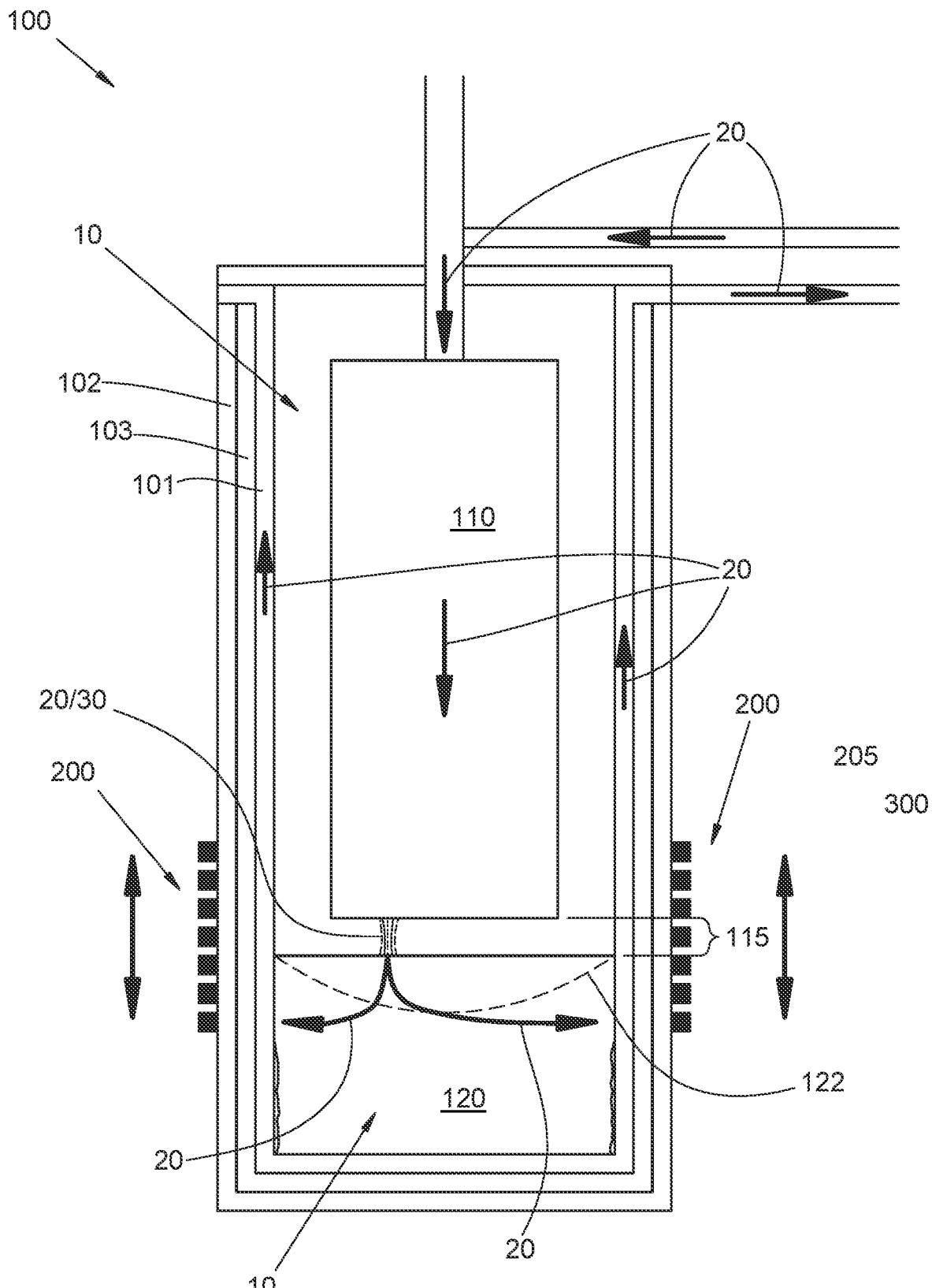
FIGS. 3A and 3B are schematic cross-sectional diagrams of another example of an inventive apparatus implemented in a remelting furnace.
Figure 3B:
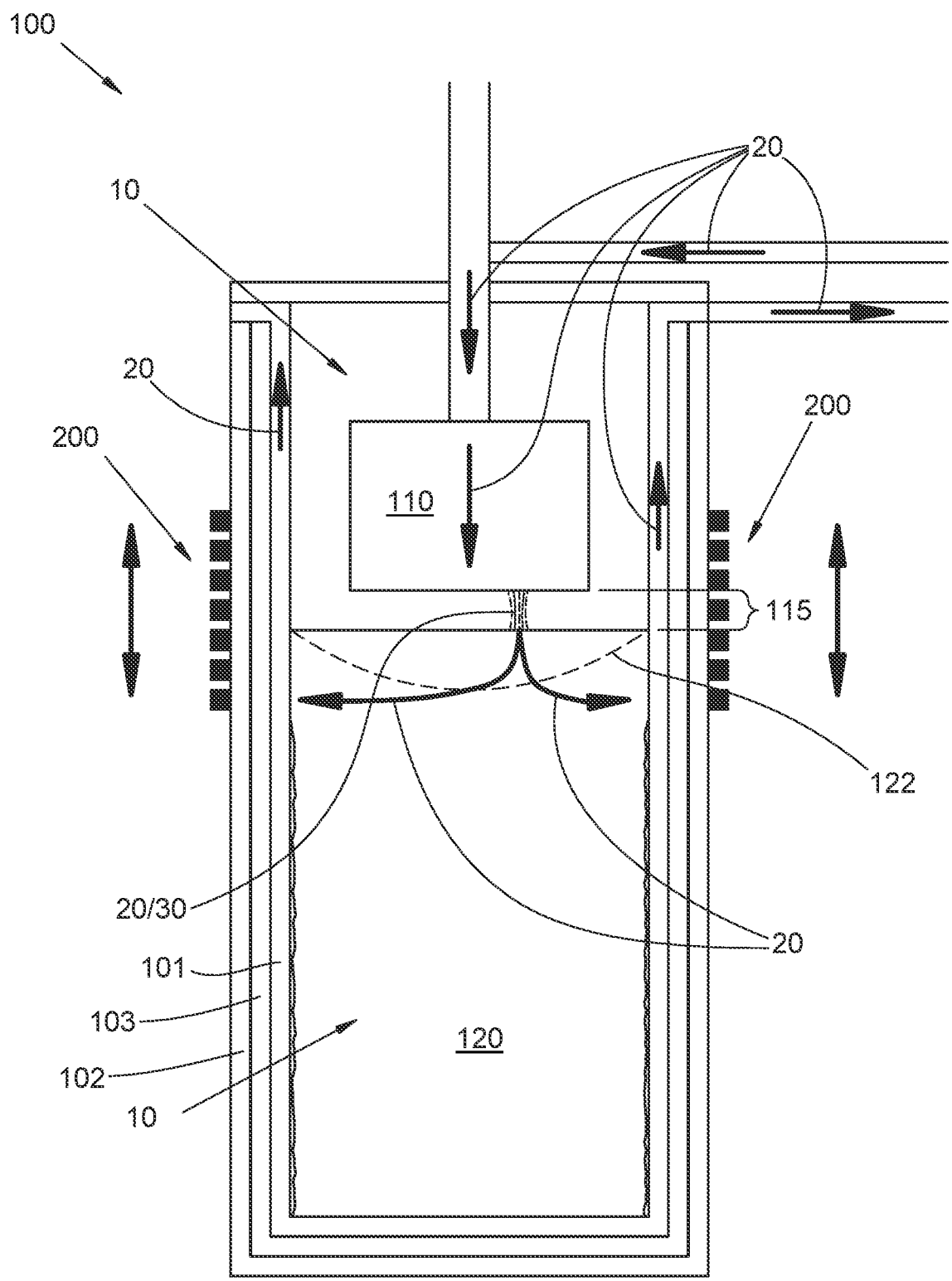
Figure 4A:
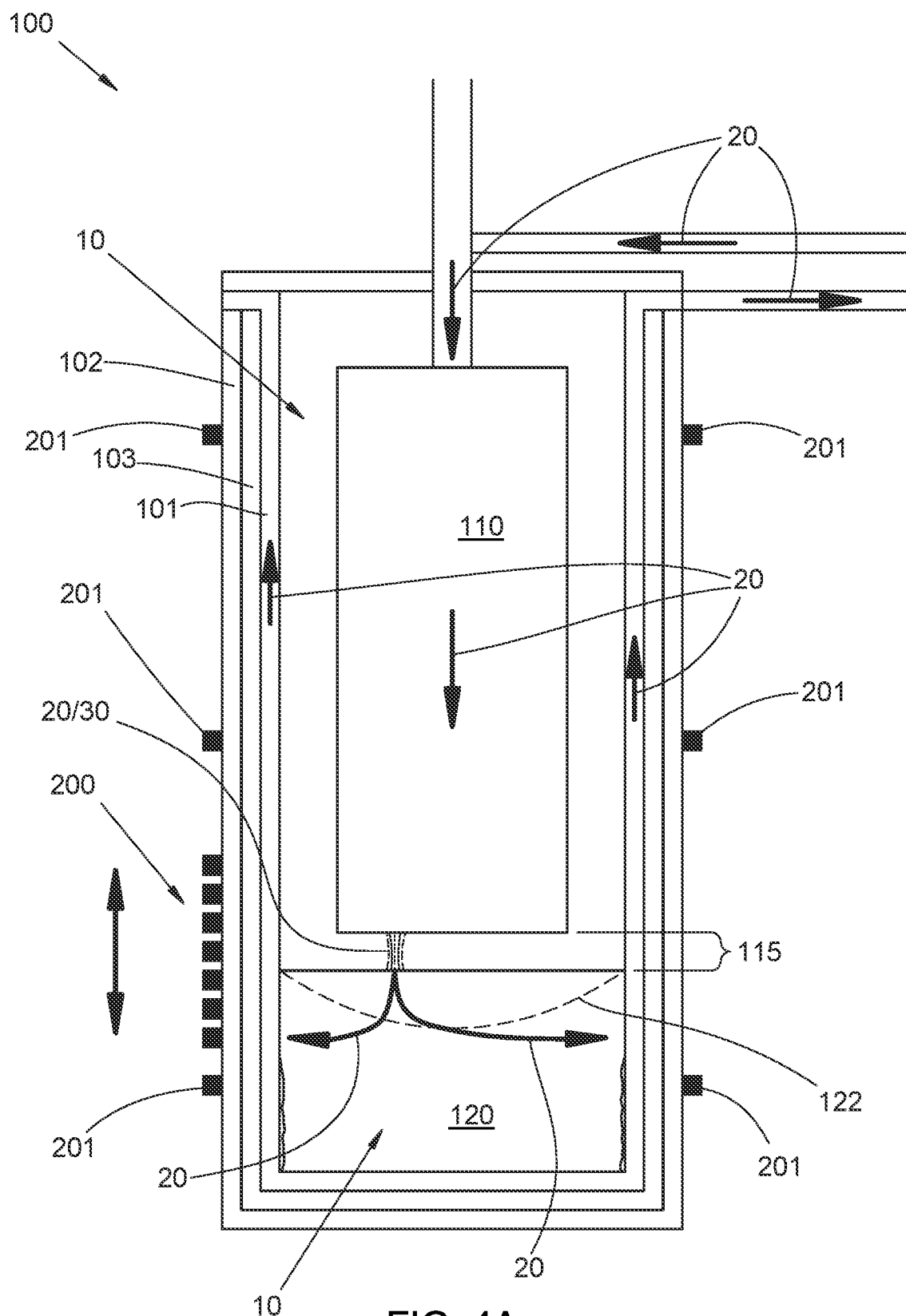
FIGS. 4A and 4B are schematic cross-sectional diagrams of another example of an inventive apparatus implemented in a remelting furnace.
Figure 4B:
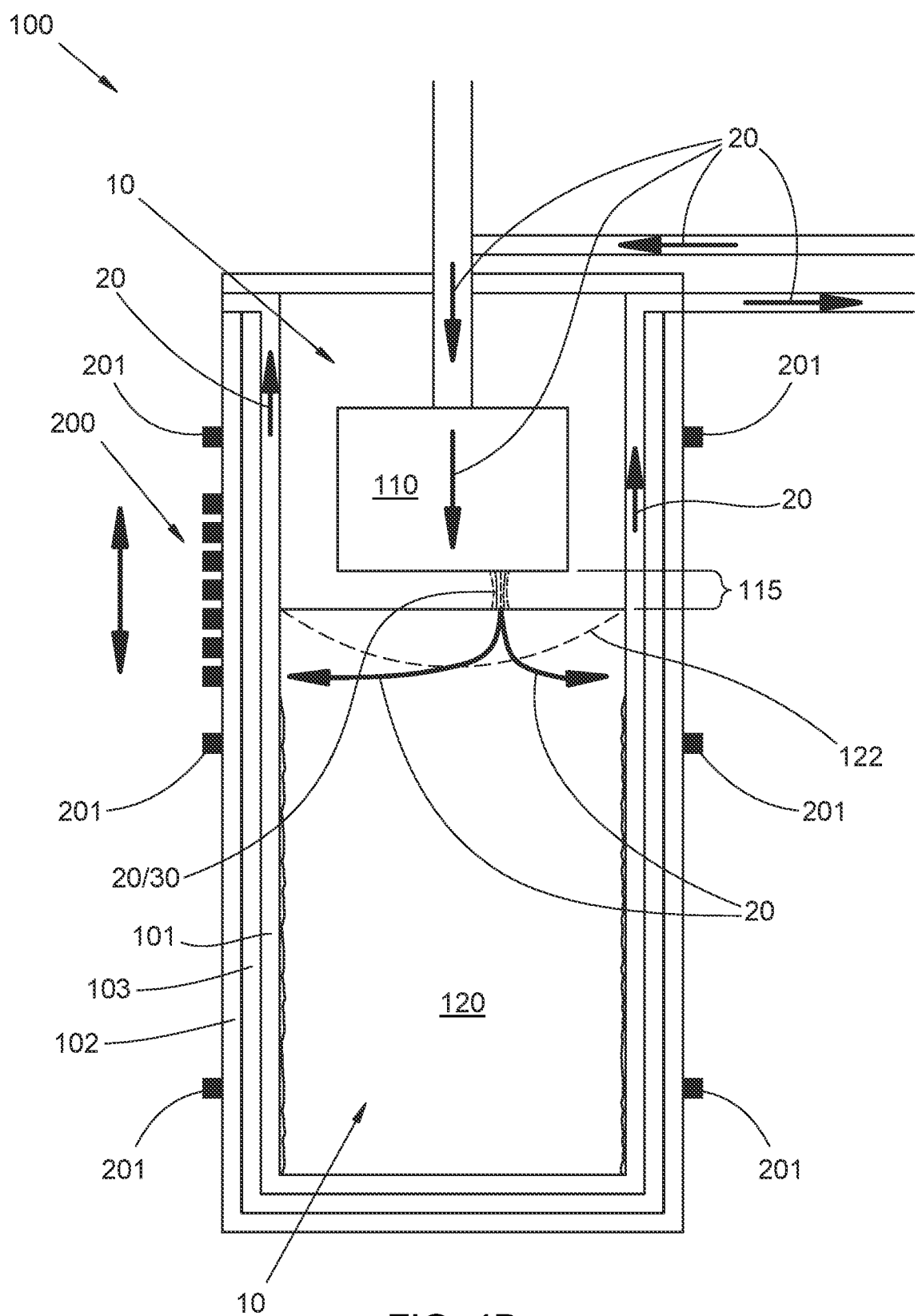
Figure 5A:
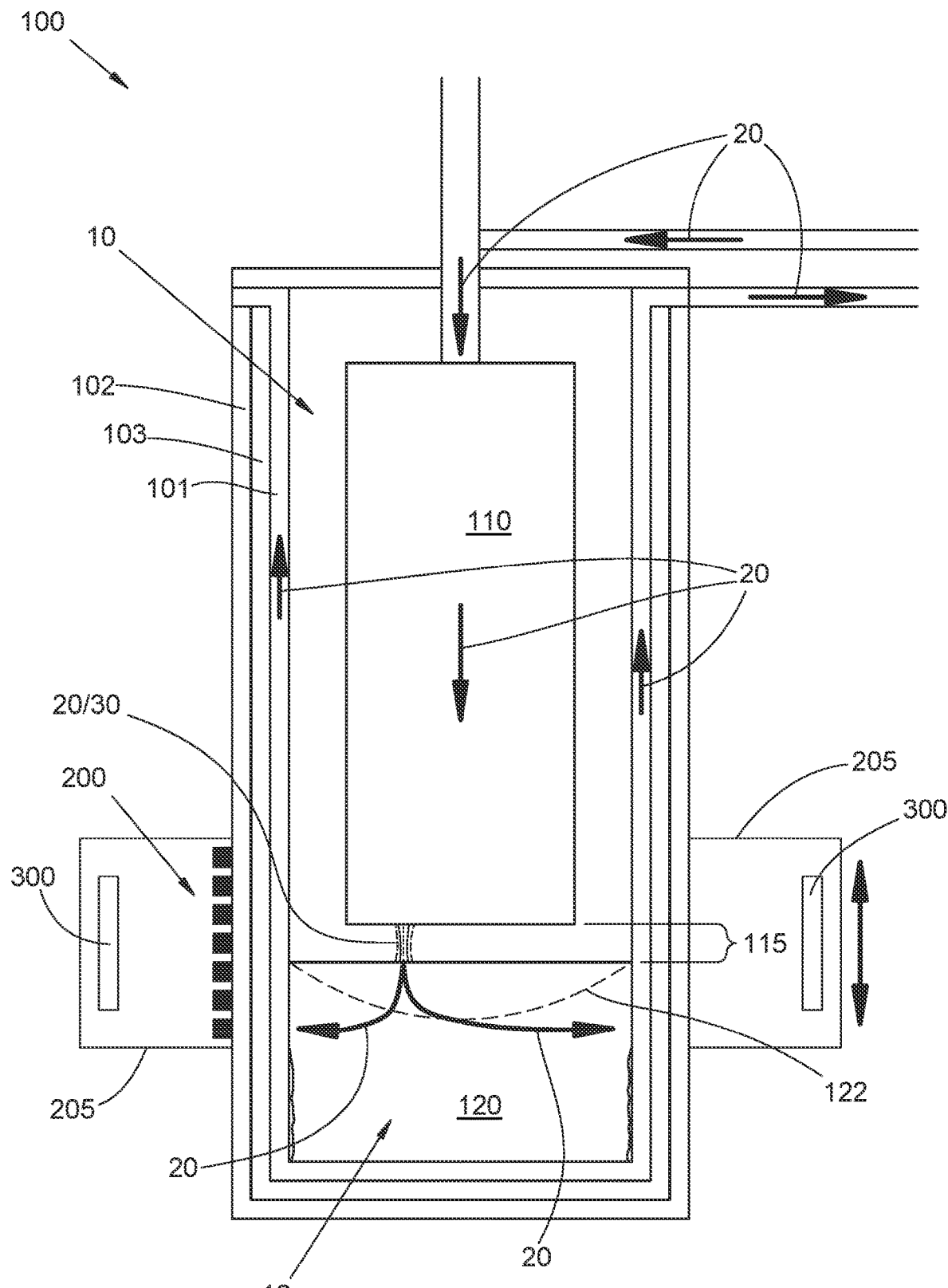
FIGS. 5A and 5B are schematic cross-sectional diagrams of another example of an inventive apparatus implemented in a remelting furnace.
Figure 5B:
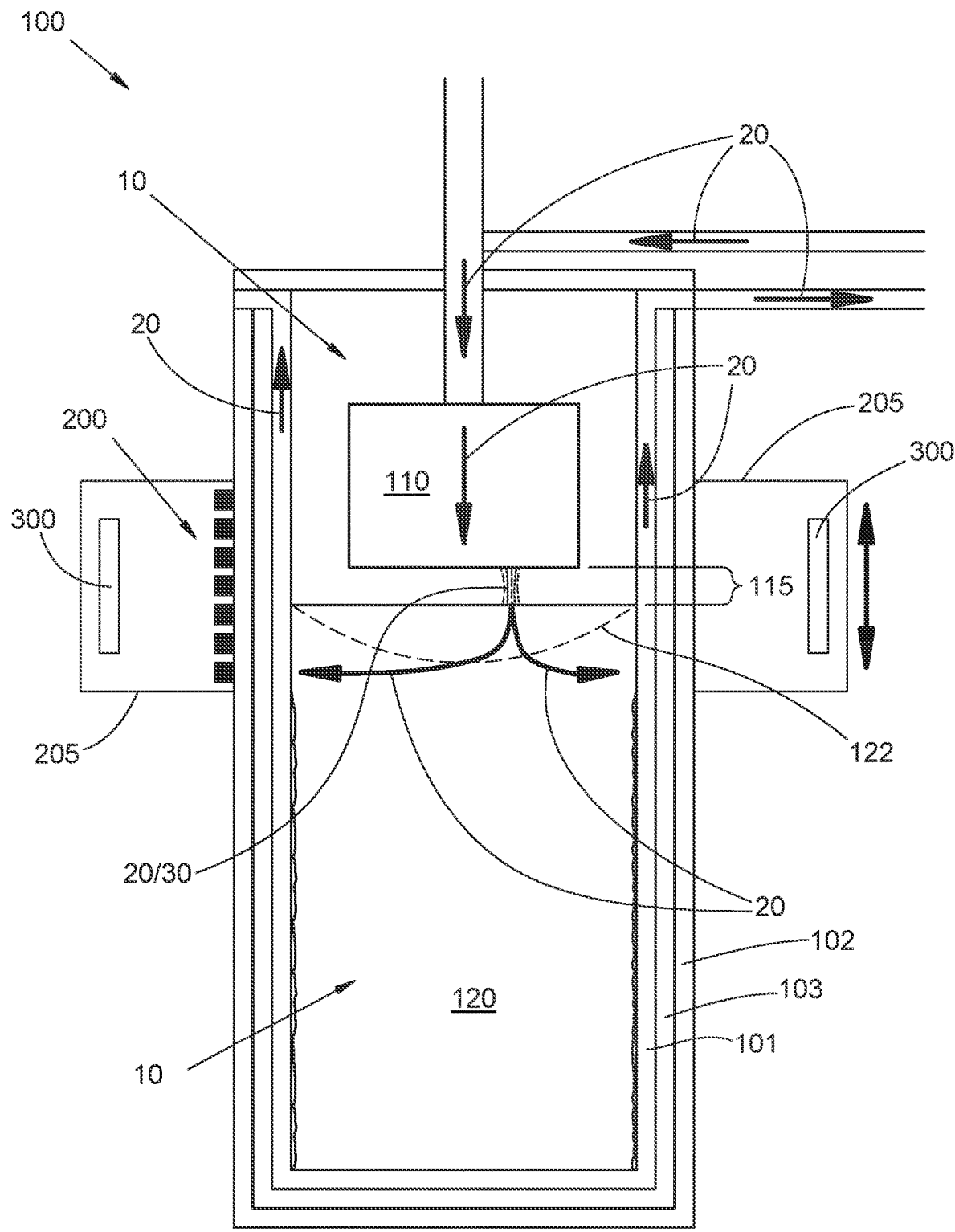
Figure 6A:
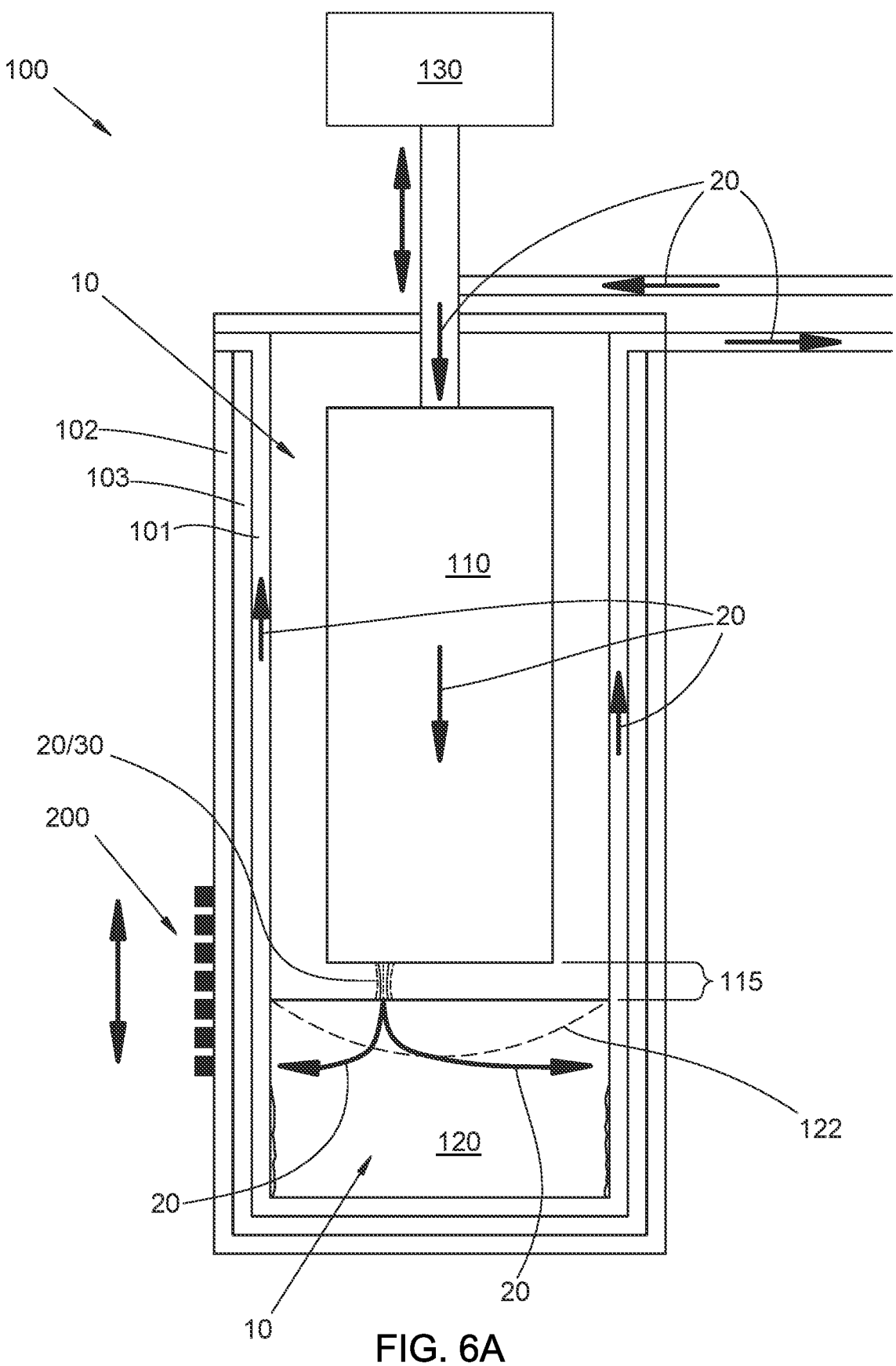
FIGS. 6A and 6B are schematic cross-sectional diagrams of another example of an inventive apparatus implemented in a remelting furnace.
Figure 6B:
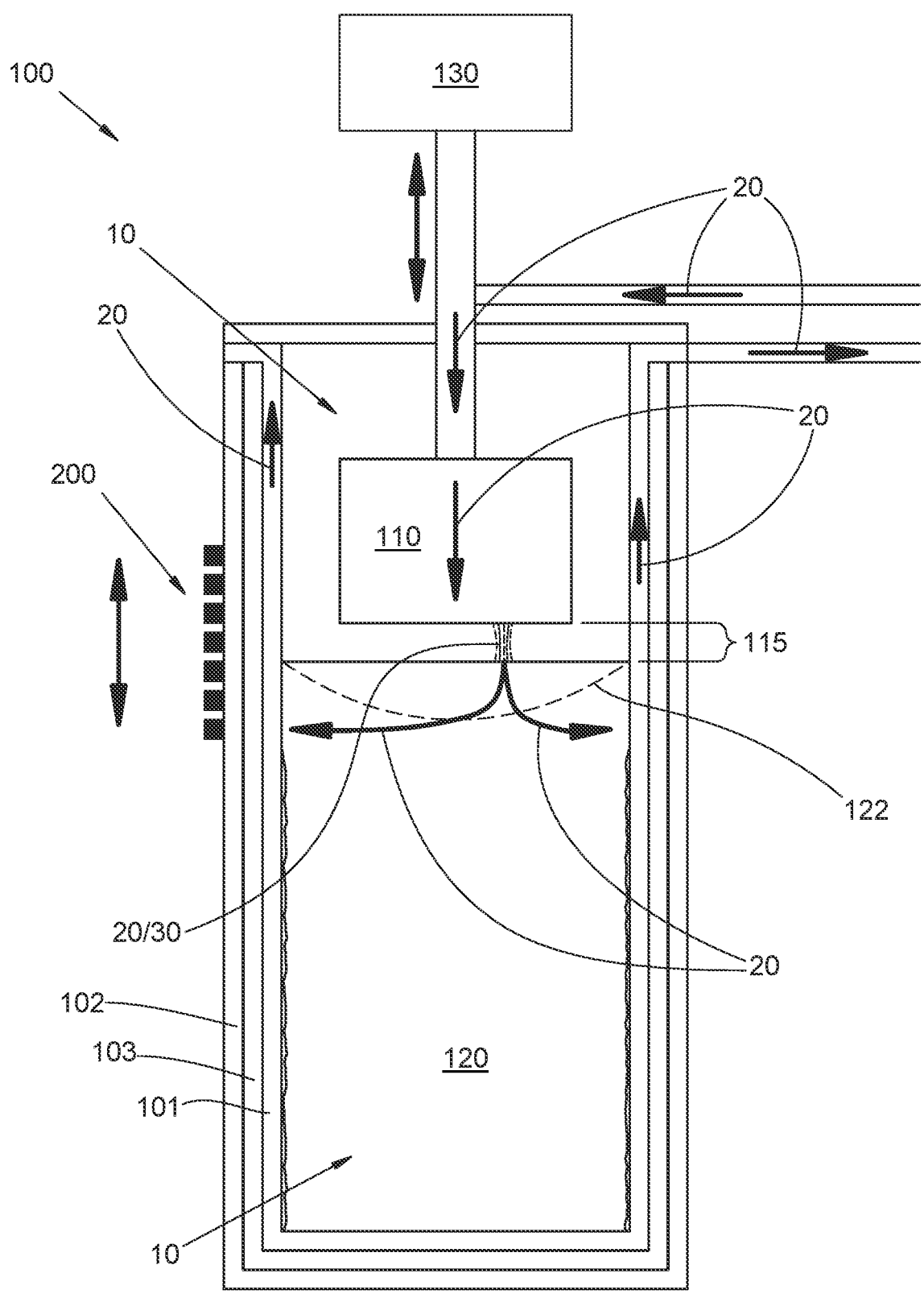
Figure 7A:
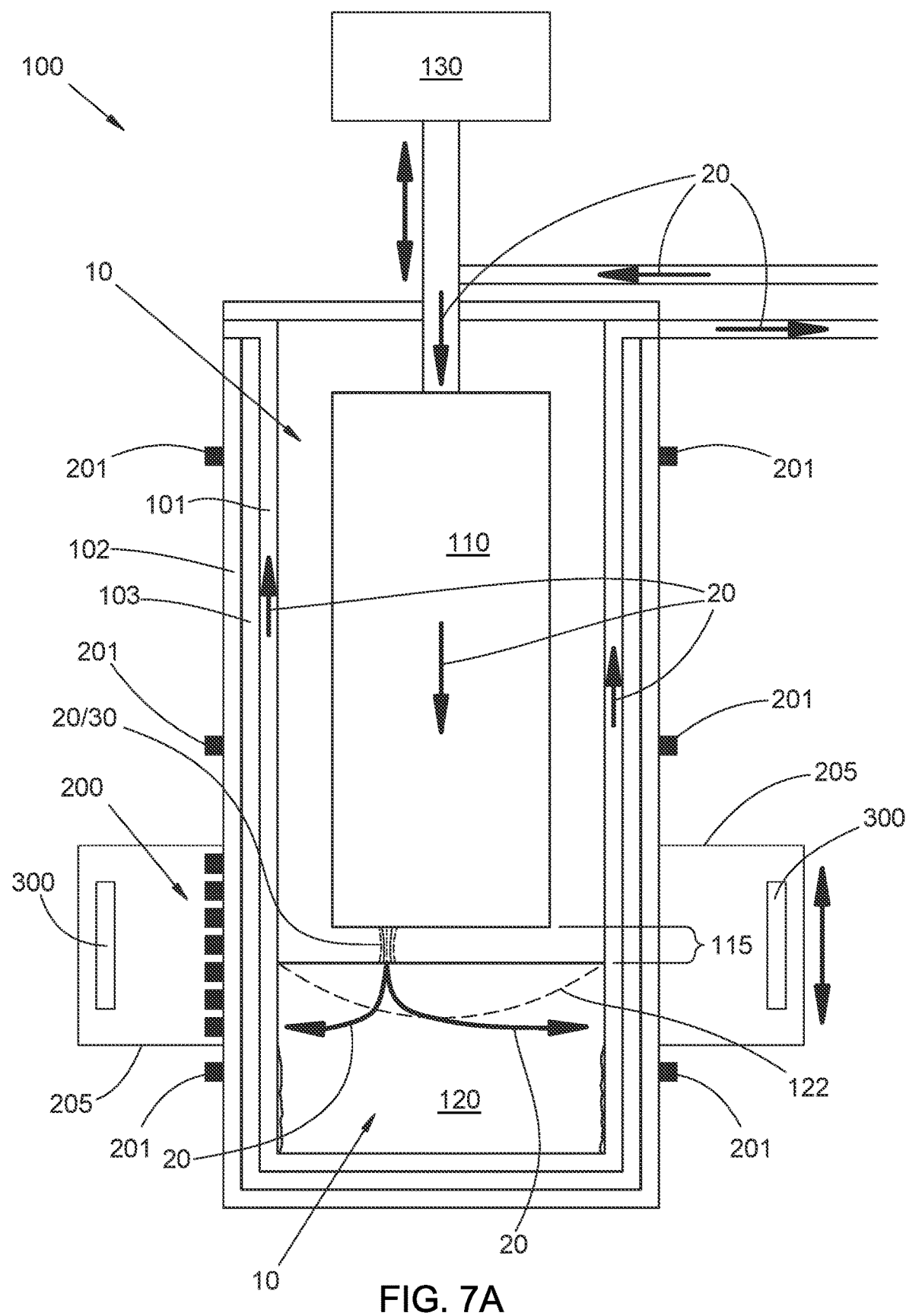
FIGS. 7A and 7B are schematic cross-sectional diagrams of another example of an inventive apparatus implemented in a remelting furnace.
Figure 7B:
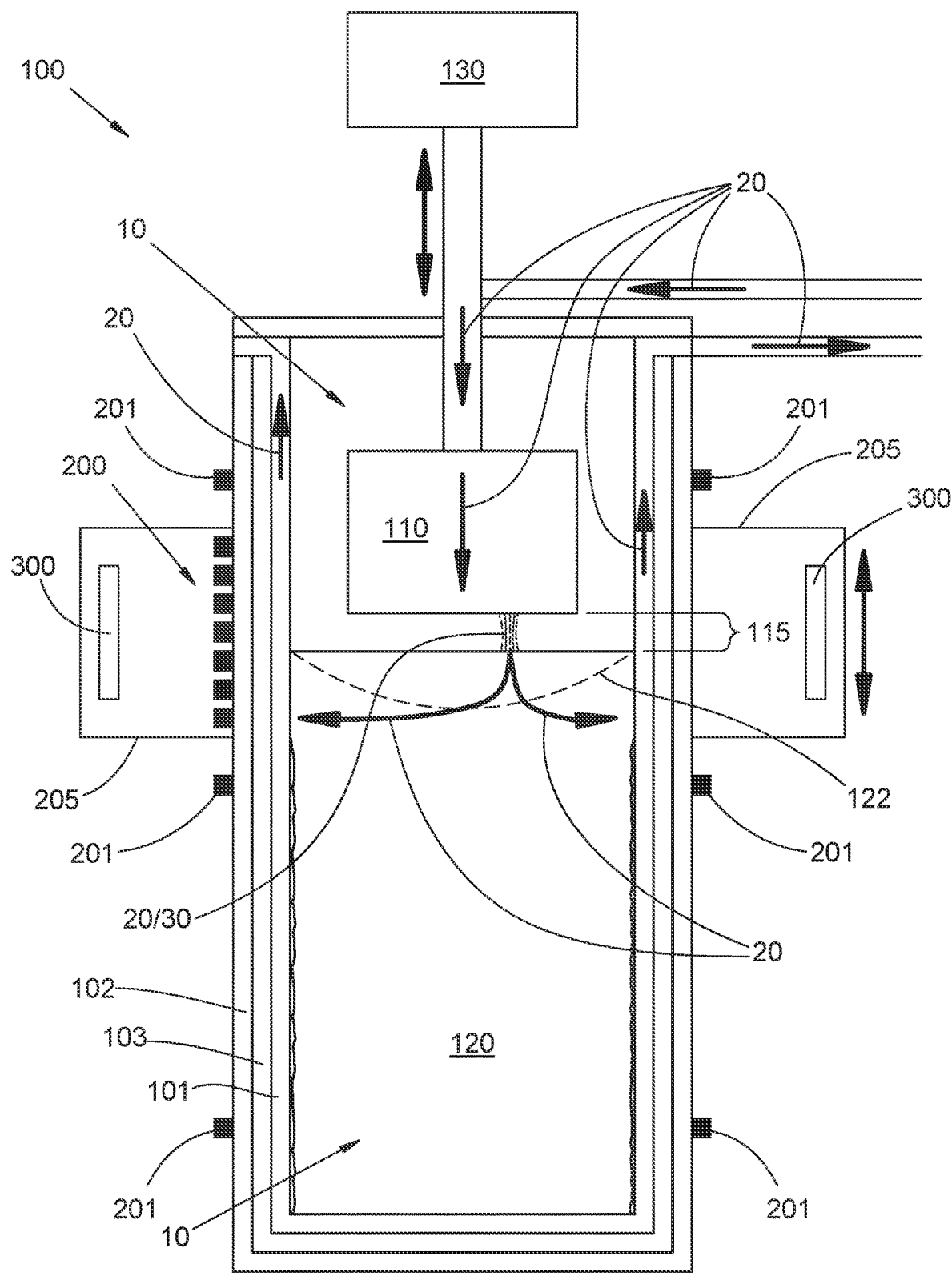

The embodiments depicted are shown only schematically; all features may not be shown in full detail or in proper proportion; for clarity certain features or structures may be exaggerated or diminished relative to others or omitted entirely; the drawings should not be regarded as being to scale unless explicitly indicated as being to scale. The embodiments shown are only examples and should not be construed as limiting the scope of the present disclosure or appended claims.

DETAILED DESCRIPTION OF EMBODIMENTS

Subject matter disclosed or claimed herein may be related to subject matter disclosed in:

U.S. provisional App. No. 62/400,018 entitled "Estimation of arc location in three dimensions" filed Sep. 26, 2016 in the names Matthew A. Cibula, Paul E. King, and C. Rigel Woodside;

U.S. Pat. No. 10,514,413 entitled "Estimation of arc location in three dimensions" issued Dec. 24, 2019 to Cibula et al;

U.S. non-provisional application Ser. No. 16/719,792 entitled "Estimation of arc location in three dimensions" filed Dec. 18, 2019 in the names Matthew A. Cibula, Paul E. King, and C. Rigel Woodside;

U.S. provisional App. No. 62/617,036 entitled "Vacuum Arc Control using Arc Position Sensing and Induced Magnetic Fields" filed Jan. 12, 2018 in the names of Matthew A. Cibula, Joshua R. Motley, C. Rigel Woodside, and Paul E. King;

U.S. provisional App. No. 62/649,570 entitled "Sensing and control of position of an electrical discharge" filed Mar. 28, 2018 in the names of Matthew A. Cibula, Joshua R. Motley, C. Rigel Woodside, and Paul E. King;

U. S. Pre-grant Pub. No. 201 9/021 961 5 entitled "Sensing and control of position of an electrical discharge" published Jul. 18, 2019 in the names of Motley et al.

Each of the references listed above is incorporated by reference as if fully set forth herein.

The references cited above disclose apparatus and methods for estimation and/or control of the transverse position of an electric discharge or arc, or other transversely localized electric current segment, that flows longitudinally across a gap between two electrically conductive bodies. Multiple magnetic field sensors are employed to measure magnetic field components arising from the current segment, and calculate an estimated position based on those measured field components and the corresponding locations at which they were measured. Magnetic field sources can be employed to cause movement of the current segment, and the field sources and field sensors can be coupled in a feedback arrangement to apply control fields based on the estimated location of the current segment. Such apparatus and methods can be usefully employed in a variety of settings. One important setting is in the field of remelting furnaces, in which an electric current flows through a conductive metal electrode to be melted, through an ingot formed from metal melting from the electrode and dripping into a melt pool on the top surface of the ingot, and through one or more localized electric current segments spanning the gap between the electrode and ingot. In some furnaces the current segment is an electric discharge or arc, and the gap is vacuum, or at most a diffuse plasma generated by the discharge or arc. In other furnaces a gaseous medium occupies the gap between the electrode and ingot, while in still other examples molten slag occupies the gap. In any of those examples, localized current segments can include transient short circuits through droplets of molten metal dripping across the gap between the melting electrode and the growing ingot (i.e., so-called drip shorts).

The quality of the ingot produced in a remelting furnace can vary according to behavior of the localized electric current segments spanning the gap between the electrode and ingot. General operating parameters of the furnace during a melt process (e.g., temperature, electrode weight or position, voltage across the gap, total current, voltage drops or current spikes due to drip shorts) can be loosely correlated with overall quality of an ingot produced by that melt. The references cited above disclose apparatus of methods for making more detailed measurements of position of the current segments as a function of three dimensional position in the furnace (and therefore as a function of three-dimensional position in the solidified ingot) to enable improved assessment of the ingot's quality (generally and as a function of position in the ingot), as well as for controlling the transverse position of the current segments during the melt process to improve the ingot's quality.

In addition to estimating and controlling transverse position of the current segments, it would also be desirable to estimate or control length of the one or more current segments between the conductive bodies (e.g., between the electrode and ingot). The length of a current segment (e.g., the length of an electric arc or a drip short) is equivalent to the longitudinal distance across the gap between the conductive bodies. In an arc remelting furnace that distance is referred to as the arc gap. Achieving a desired melt rate, or maintaining a consistent melt rate, typically relies at least partly on the ability to achieve a desired arc gap or maintain a consistent arc gap. Previous efforts rely on indirect measurements such as the weight of the electrode (which decreases as it melts), the position of an electrode actuator (which typically moves the electrode downward as it melts), or the voltage drop between the electrode and the ingot. Those measured quantities are loosely correlated with the arc gap. In some examples the average rate of occurrence of drip shorts can serve as an indirect measure of the gap distance (with a smaller gap resulting in more frequent drip shorts). The drip rate typically enables only relatively slow adjustment of the arc gap. In addition, in some examples the optimum arc gap is too large and drip shorts do not occur, and in some instances the particular metal being remelted does not produce drip shorts during remelting. The drip rate and other indirect measurements of the arc gap provide only an average and are not sensitive to the topography of the surfaces that form the gap (e.g., in a remelting furnace, the melt pool of the ingot might be relatively flat with a meniscus at its edges, while the electrode surface can exhibit a wide range of topography, including, e.g., flat, convex, concave, or more complex curved surfaces, that can be relatively smooth or can include pits, prominences, or other roughness or irregularities. The topography can vary among different electrodes or even among different times during a melt process of a single electrode. Measurement or estimation of the gap topography can provide an additional way to assess the position-dependent quality of the ingot.

Accordingly, inventive apparatus and methods are disclosed herein that enable estimation of corresponding length parameter(s) and longitudinal position(s) of one or more transversely localized electric current segments flowing across a gap between two conductive bodies using one or more movable magnetic field sensors. Such an estimate of the length or length parameter of a current segment is equivalent to an estimate of the distance across the gap at the transverse location of that current segment. The term "length parameter" is employed because measured or calculated quantities described below are correlated with the length of the current segment (e.g., proportional, or related by a specific functional form; possibly dependent on specific materials, sizes, or geometries of a sensing volume or the conductive bodies), but do not necessarily yield the absolute current segment length or absolute gap distance. However, absolute knowledge of the gap distance may not be needed in many instances; calculating, storing, or controlling the related length parameter is often sufficient, particularly if that length parameter is observed to correlate well with characteristics of, e.g., an ingot produce by a remelting process in which that length parameter was employed for characterization or control. Accordingly, any disclosed estimation, calculation, mapping, or control of a length of a current segment or a gap distance shall be understood to also encompass estimation, calculation, mapping, or control of a corresponding length parameter. In other words, "length" of a current segment, "gap distance" at the position of that current segment, and a corresponding "length parameter" characterizing that current segment shall be considered interchangeable for purposes of the present disclosure and appended claims, except where otherwise implied or explicitly stated in a specific context. The estimated longitudinal position(s) of the one or more current segments can be used to control one or more sensor actuators to control longitudinal positions the movable sensors; the estimated length(s) of the one or more current segments can be used to control a conductive member actuator to control longitudinal position of one or both conductive bodies (and hence the gap distance between them).

A general arrangement of an inventive apparatus is illustrated schematically in FIG. 1 and includes a computer system 299, one or more movable magnetic field sensors 200, and one or more sensor actuators. The computer system 299 includes one or more electronic processors and one or more digital storage media coupled thereto. The one or more magnetic field sensors 200 are movable longitudinally along a lateral periphery of a sensing volume 10 through which an electric current 20 flows in a generally longitudinal direction. The current 20 flows (i) through a first electrically conductive body 110 at least partly within the sensing volume 10, (ii) through a second electrically conductive body 120 at least partly within the sensing volume 10, and (iii) across a gap 115 between the first and second conductive bodies 110/120 as the one or more transversely localized electric current segments 30. One or more sensor actuators (not labelled in the drawings; resulting movement indicated by double-headed arrows) are arranged so as to move the one or more movable sensors 200 longitudinally along the sensing volume 10 in response to sensor position control signals generated by and transmitted from the computer system 299. The computer system 299 is operatively coupled to the one or more movable sensors 200 and to the one or more sensor actuators and receives signals from them. Signal received from the one or more sensor actuators are indicative of corresponding longitudinal positions of the one or more movable sensors 200 along the sensing volume 10; signals received from the one or more movable sensors 200 are indicative of the corresponding magnetic field components measured by the one or more movable sensors 200. The computer system 299 generates, and transmits to the one or more sensor actuators, the sensor position control signals. The computer system 299 calculates corresponding estimated length parameter(s) and longitudinal position(s) of the one or more current segments 30. That calculation is based at least in part on (i) magnetic field components measured at multiple different longitudinal positions along the sensing volume 10 and (ii) for each of those measured magnetic field components, a corresponding longitudinal position along the sensing volume 10 at which that magnetic field component was measured by a corresponding one of the one or more movable sensors 200.

The movable magnetic sensors 200 can be of any suitable type or arrangement (e.g., Hall sensors). Each movable sensor 200 can measure magnetic field components in one, two, or three spatial dimensions. In some examples the one or more movable sensors 200, collectively, can measure magnetic field components in all three spatial dimensions. In some examples one or more or all of the sensors 200 can measure magnetic field components in all three spatial dimensions. The sensor actuators can be of any suitable type or arrangement and can include one or more of, e.g., lead screw, rack-and-pinion mechanism, belt or pulley, gears, counterweights, tension or compression springs, AC or DC electric motors, servo or stepper motors, translation stages, and so forth. The sensor actuators include position sensors (integrated or as separate components) that generate signals indicative of positions of the respective movable sensors 200; those signals are transmitted to and received by the computer system 299. The position sensors can be of any suitable type or arrangement, including, e.g., linear or rotary encoder, optical rangefinder, potentiometer, and so forth.

Figure 10A:
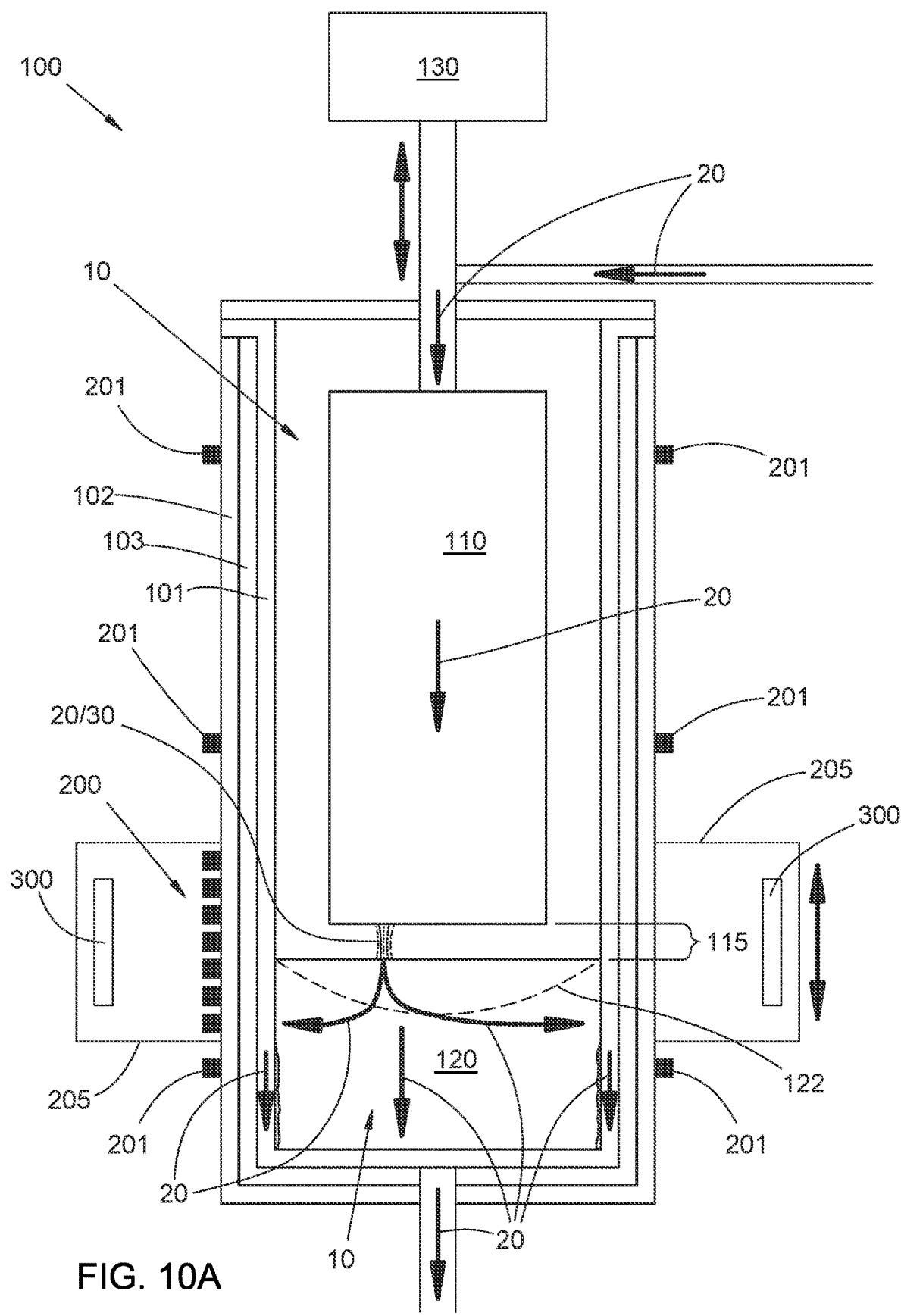
FIGS. 10A and 10B are schematic cross-sectional diagrams of another example of an inventive apparatus implemented in a remelting furnace.
Figure 10B:
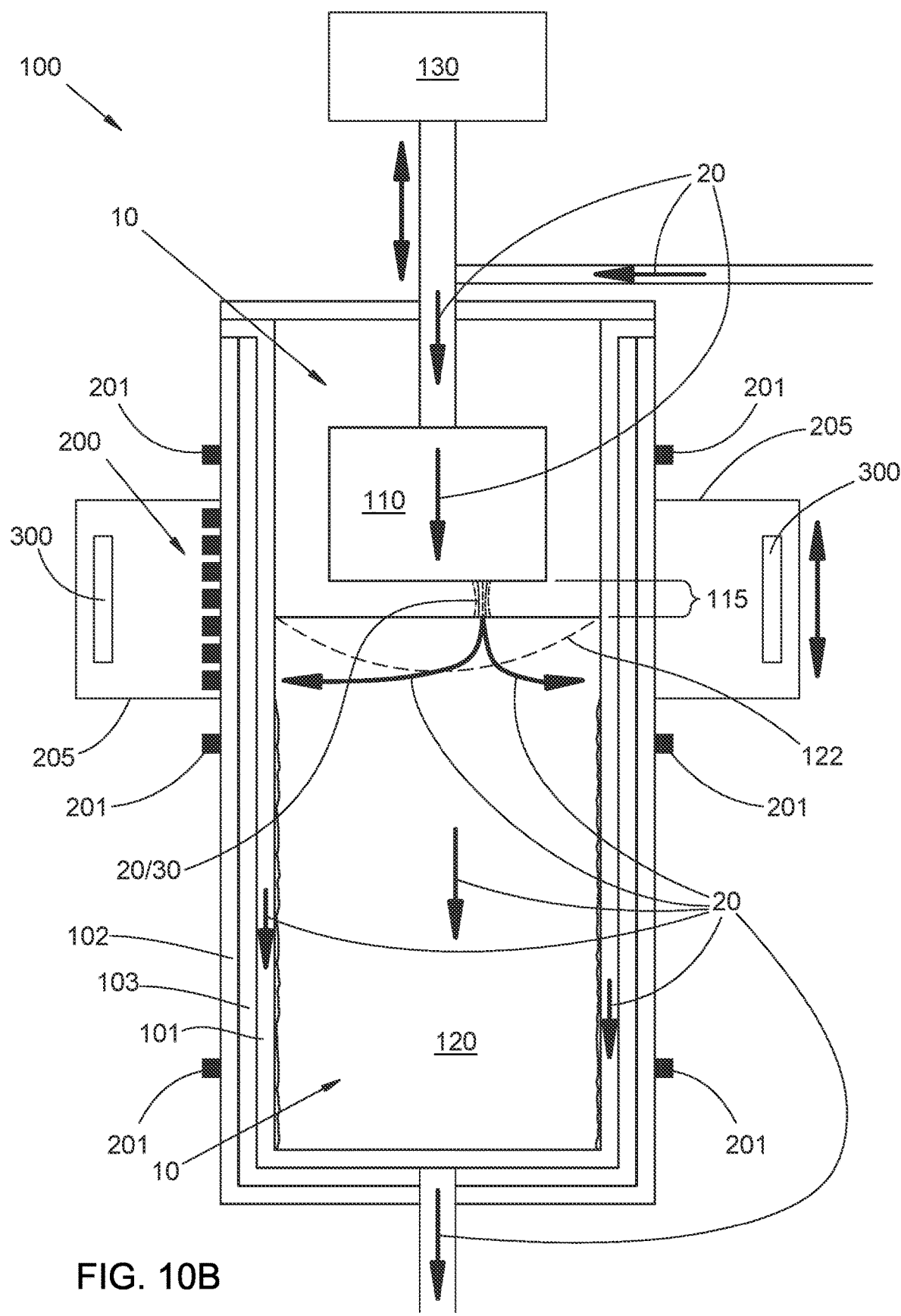

The sensing volume 10 can be any space through which the current 20 flows through the conductive bodies 110/120 and across the gap 115 between them. Any suitable medium that permits the current 20 to flow through the one or more current segments 30 can fill the gap 115, e.g., vacuum, a gaseous medium, a liquid medium, or a solid medium. In a common arrangement the sensing volume 10 is the interior of a remelting furnace 100 (e.g., as in FIGS. 2A through 7B, 10A, and 10B). In such examples the first conductive body 110 is the electrode 110 of the furnace 100, and the second conductive body 120 is the ingot 120 formed in the crucible 101 of the furnace 100. The electric current 20 flows through the sensing volume 10 in a generally longitudinal direction through the electrode 110, across the gap 115, and through the ingot 120. The examples shown in FIGS. 2A through 7B show the current 20 flowing from the ingot 120 upward through the walls of the crucible 101 and out of the top of the furnace 100. The example of FIGS. 10A and 10B is similar to the example of FIGS. 7A and 7B, except that the current 20 flows from the ingot 120 downward through the walls of the crucible 120 and out of the bottom of the furnace 100; the examples of FIGS. 2A through 6B can also be arranged with the current 20 flowing out of the bottom of the furnace 100. The current 20 can flow across the gap 115 as one or more transversely localized current segments 30. The current 20 flowing across the gap 115 heats the electrode 110 to above its melting point, and molten metal drips or flows into a melt pool 122 that forms at the top of the ingot 120, which solidifies as it cools. The furnace 100 can include a cooling jacket 103 and an outer wall 102; the movable sensors 200 and the sensor actuators are located outside the crucible 101, and often outside the outer wall 102. As the electrode 110 melts and the ingot 120 grows during the remelting process, the gap 115 moves upward through the sensing volume 10, and the sensor actuators can move the movable sensors 200 along with the moving gap 115. That movement is illustrated schematically by the different longitudinal positions of the gap 115 and the sensors 200 in FIG. 2A (earlier in the remelting process, as is also the case for FIGS. 3A/4A/5A/6A/7A/10A) versus FIG. 2B (later in the remelting process, as is also the case for FIGS. 3B/4B/5B/6B/7B/10B). For each remelting process the computer system 299 can generate and store a profile of estimated longitudinal position(s) and length parameter(s) of the one or more current segments as a function of melt time. That stored profile can be associated with the ingot produced by that remelting process for evaluation or quality control purposes.

The remelting furnace 100 can be of any suitable type or arrangement, e.g., a vacuum arc remelting (VAR) furnace or an electroslag remelting (ESR) furnace. In various examples the one or more current segments 30 can include, e.g., an electric discharge or arc formed across the gap 115 (through vacuum, a diffuse plasma, or other gaseous medium) between the first and second conductive bodies 110/120 (e.g., typical in a VAR furnace), a current flowing through a molten slag layer located in the gap 115 (e.g., typical in an ESR furnace), or a transient short circuit through a droplet of molten metal that drips across the gap 115 between the first and second conductive bodies 110/120. In some examples, at least one of the current segments 30 flows through a conductive rod or wire connecting the first and second conductive bodies 110/120 across the gap 115; the rod or wire has a transverse cross-sectional area that is less than a transverse cross-sectional area of the first or second conductive bodies 110/120. Such a conductive rod or wire can in some instances be employed for characterization, calibration, or diagnosis of the magnetic field sensors 200. In various examples the transverse cross-sectional area of such a rod or wire can be as small as about a square millimeter up to about half of the transverse cross-sectional area of the first or second conductive bodies 110/120.

Longitudinal position(s) of the one or more current segments 30 are about equal to a longitudinal position within the sensing volume 10 of the gap 115 between the first and second conductive bodies 110/120. Length(s) of the one or more current segments 30 are about equal to corresponding distance(s) across the gap 115 between the first and second conductive bodies 110/120 at corresponding transverse position(s) within the gap 115 of the one or more current segments 30. For each remelting process the computer system 299 can generate and store a profile of estimated longitudinal position(s) and length parameter(s) of the one or more current segments as a function of melt time. That stored profile can be associated with the ingot produced by that remelting process for evaluation or quality control purposes. In some examples distance across the gap 115 is substantially invariant with respect to transverse position (e.g., substantially flat, parallel surfaces of the electrode 110 and ingot 120); in other examples distance across the gap 115 varies with transverse position. In those latter examples it may be desirable to map the topography of the gap 115 (i.e., map the distance across the gap 115 as a function of two-dimensional transverse position within the gap 115; discussed further below).

In some examples more than one current segment 30 carries the current 20 across the gap, at least transiently (e.g., multiple simultaneous arcs, an arc and a concurrent drip short, or multiple simultaneous current paths through a slag layer). In some examples only a single current segment 30 carries the current 20 across the gap 115 (e.g., a single arc between successive drip shorts, a single arc from an electrode 110 that does not exhibit drip shorts, or a single current path through a slag layer).

In some examples, the computer system 299 can also calculate corresponding estimated transverse position(s) of the one or more current segments 30. That calculation is based at least in part on (i) magnetic field components measured at multiple different circumferential positions around at least a portions of the lateral periphery of the sensing volume 10 and (ii) for each of those measured magnetic field components, a corresponding circumferential position around the sensing volume 10 at which that magnetic field component was measured. Note that use of "circumferential" does not imply that the sensing volume is cylindrical or has a circular cross section. Note that "circumferential" is intended to denote only that, if a cylindrical coordinate system is defined with the longitudinal direction along the z-coordinate and the r- and θ-coordinates arranged in the transverse plane, then "at multiple different circumferential positions" means "at multiple different angles θ," regardless of the shape of the sensing volume 10 or the corresponding value of the r-coordinate. In some examples the one or more movable sensors 200 include movable sensors 200 positioned at multiple different circumferential positions around at least a portion of the lateral periphery of the sensing volume 10 (e.g., as in FIGS. 3A/3B, 7A/7B, and 10A/10B), and magnetic field components measured by those movable sensors 200 are included in the calculation of transverse position(s) of the one or more current segments 30. Instead or in addition, some examples can include multiple stationary magnetic field sensors 201 positioned at multiple different circumferential positions around at least a portion of the lateral periphery of the sensing volume 10

(e.g., as in FIGS. 4A/4B, 7A/7B, and 10A/10B), and magnetic field components measured by those stationary sensors 201 are included in the calculation of transverse position(s) of the one or more current segments 30. In various remelting furnace examples, the estimated transverse positions of the current segment(s) 30 can be included with the longitudinal positions(s) and length parameter(s) in a stored profile for an ingot 120 produced by a remelting process.

Magnetic sensors positioned at multiple different circumferential positions, whether the movable sensors 200 or the stationary sensors 201, in various examples can include one or more rings of sensors 200 or 201. Each such ring of sensors includes multiple sensors positioned at substantially the same longitudinal position along the sensing volume 10 and at multiple different circumferential positions around the lateral periphery of the sensing volume 10. If more than one ring of sensors is employed, the corresponding longitudinal position along the sensing volume 10 of each ring of sensors differs from that of at least one other ring of sensors. Each such ring of stationary sensors 201 is positioned at a corresponding fixed location along the sensing volume 10. Such rings of movable sensors 200 can be attached to a sensor platform 205 that is movable in a longitudinal direction along the sensing volume 10 (e.g., as in FIGS. 5A/5B, 7A/7B, and 10A/10B), in fixed corresponding positions along the sensor platform 205 or movable along the sensor platform 205.

In examples that enable estimation of transverse position(s) of the one or more current segments 30, the computer system can calculate an estimated transverse topography of the gap 115 between the first and second conductive bodies 110/120. That calculation is based on estimated length parameters and positions of one or more current segments 30 at multiple different estimated transverse positions within the gap 115. In some examples, uncontrolled transverse movement within the gap 115 of the one or more current segment 30 results in estimated gap distances at multiple different transverse positions. The corresponding positions and distances can be combined to yield the estimated transverse topography of the gap 115.

Some examples include one or more magnetic field sources 300 that are positioned at the lateral periphery of the sensing volume 10 and operatively coupled to the computer system 299. Each source 300 is arranged to apply, in response to control signals generated by and transmitted from the computer system 299, a corresponding applied magnetic field having a corresponding non-zero component directed transversely across at least a portion of the sensing volume 10 that includes the gap 115 (e.g., as in FIGS. 5A/5B, 7A/7B, and 10A/10B). In some examples the field sources 300 can be movable along the sensing volume 10, e.g., to track movement of the gap 115 (attached to the movable sensor platform 205 in some of those examples, including the example shown in FIGS. 5A/5B, 7A/7B, and 10A/10B; discussed further below); in some examples multiple field sources 300 can be positioned at multiple different fixed positions along the sensing volume 10. The computer system 299 generates, and transmits to the one or more sources 300, the corresponding control signals, based at least in part on the estimated transverse position of the one or more current segments 30 and one or more corresponding source positions. The resulting applied magnetic field(s) control or alter the estimated transverse position of the one or more current segments 30 according to a selected transverse position, transverse trajectory (e.g., circular, spiral, raster, sinusoidal, and so forth), or transverse distribution for the one or more current segments (e.g., based on effective dwell time; gaussian, ring or doughnut, uniform, and so forth). In some examples the computer system 299 can couple the sources 300 to the magnetic field sensors 200 (and 201, if present) in a servomechanism arrangement. In some examples such control of the transverse position(s) of the one or more current segments 30 can be employed, e.g., to improve quality of the ingot 120 produced by a remelting process, relative to quality resulting from uncontrolled movement of the one or more current segments 30 during the remelting process.

In some examples, the computer system can transmit to the one or more sources 300 control signals that result in movement of the one or more currents segments 30 among multiple estimated transverse positions, and then calculate an estimated transverse topography of the gap 115 based on estimated length parameters and positions of one or more current segments 30 at those multiple different estimated transverse positions. In effect, the sources 300 can be used to scan a current segment 30 transversely across the gap 115 to map out its topography. Such mapping of the gap topography, whether acquired by controlled or uncontrolled transverse movement of the current segment(s) 30 within the gap 115, can be usefully employed to characterize the quality of the ingot 120 produced by the remelting process, and can be included in the stored profile of estimated longitudinal position(s) and length parameter(s) of the current segment(s) 30 associated with that ingot 120.

The one or more movable sensors 200 and the one or sensor actuators can be arranged in any suitable way to enable measurement of magnetic field components at multiple different longitudinal position, to in turn enable calculation of estimated length parameter(s) and longitudinal position(s) of the one or more current segments 30. Generally, the computer system 299 directs movement of the movable sensors 200 to remain near the gap 115, even as the gap 115 moves along the sensing volume 10 as in a remelting furnace 100. Myriad different arrangements can be employed.

In some examples, each movable sensor 200 is movable independently of the others. In some of those examples, the computer can direct independent movement of the movable sensors 300; in some other of those examples, the computer can direct coordinated movement of the movable sensors 300 (e.g., as if they were rigidly attached to a moving platform). In some examples the movable sensors 200 are in fact attached at multiple different longitudinal positions to a movable sensor platform 205 (e.g., as in FIGS. 5A/5B, 7A/7B, and 10A/10B; and in some of those examples, also at multiple different circumferential positions on the sensor platform 205, as described above). Note that "platform" is used generically to denote any structure suitable for attachment and support of the movable sensors 300 and movement along the sensing volume 10. A platform actuator of any suitable type or arrangement (including those listed above) is directed by the computer system to move the sensor platform 205 to a desired longitudinal position along the sensing volume 10, so that the platform actuator effectively acts as multiple coordinated sensor actuators. In some of those examples, the movable sensors 200 are attached at multiple different fixed longitudinal positions on the sensor platform 205, resulting in coordinated movement of the movable sensors 200; some other of those examples can include one or more of the movable sensors 200 attached to the sensor platform 205 but movable in the longitudinal direction along the sensor platform 205, enabling movement of at least one movable sensor 200 that is independent of movement of the others.

Regardless of independent or coordinated movement of the movable sensors 200, in some examples, the computer system directs one or more of the sensor or platform actuators to position at least one of the movable sensors 300 within a selected longitudinal distance limit of an estimated longitudinal position of the gap 115. In various of those examples, the selected distance limit can be an absolute limit (e.g., 1 inch or 3 inches; other suitable distances can be selected) or can be a specified fraction or multiple of a specified target gap distance (e.g., 50% or 75% of the target gap distance, or 1.5 times or 2 times the target gap distance; other suitable fractions or multiples can be selected). In some examples, the computer system 299 directs movement of two or more of the movable sensors 200 so that the estimated longitudinal position of the gap 115 is between the corresponding longitudinal positions of at least two of those two or more movable sensors 200. In other words, the movable sensors "span" the gap 115. Whatever criterion is employed (e.g., distance from the gap 115, or spanning the gap 115, or other), the computer system 299 can couple one or more of the sensor actuators and one or more of the movable sensors 200 in a servomechanism arrangement that maintains the positioning of those movable sensors 200 relative to the position of the gap 115, even as it moves through the sensing volume 10. Such positioning based on estimated longitudinal position of the gap 115 can be advantageously employed in the remelting furnace 100; the computer system can direct movement of the movable sensors 200 to maintain the positioning of those movable sensors 200 relative to the position of the gap 115 during the remelting process as the electrode 110 melts, the ingot 120 grows, and the gap 115 moves longitudinally through the furnace 100.

In various examples, calculation of the estimated length parameter(s) of the one or more current segments 300 can be based at least partly on corresponding transverse magnetic field components, longitudinal magnetic field components, or both transverse and longitudinal magnetic field component, that are measured at two or more longitudinal positions along the sensing volume 10. In some examples the field component measurements for a given calculation can be made by one of the movable sensors 200 that moves among those two or more measurement positions to make those measurements (analogous to a single-channel scan). In some examples the field component measurements for a given calculation can be made by two or more movable sensors 200 each positioned at a corresponding one of the two or more measurement positions (analogous to multichannel detection). In some examples, both of those types of measurements can be employed.

Figure 8B:
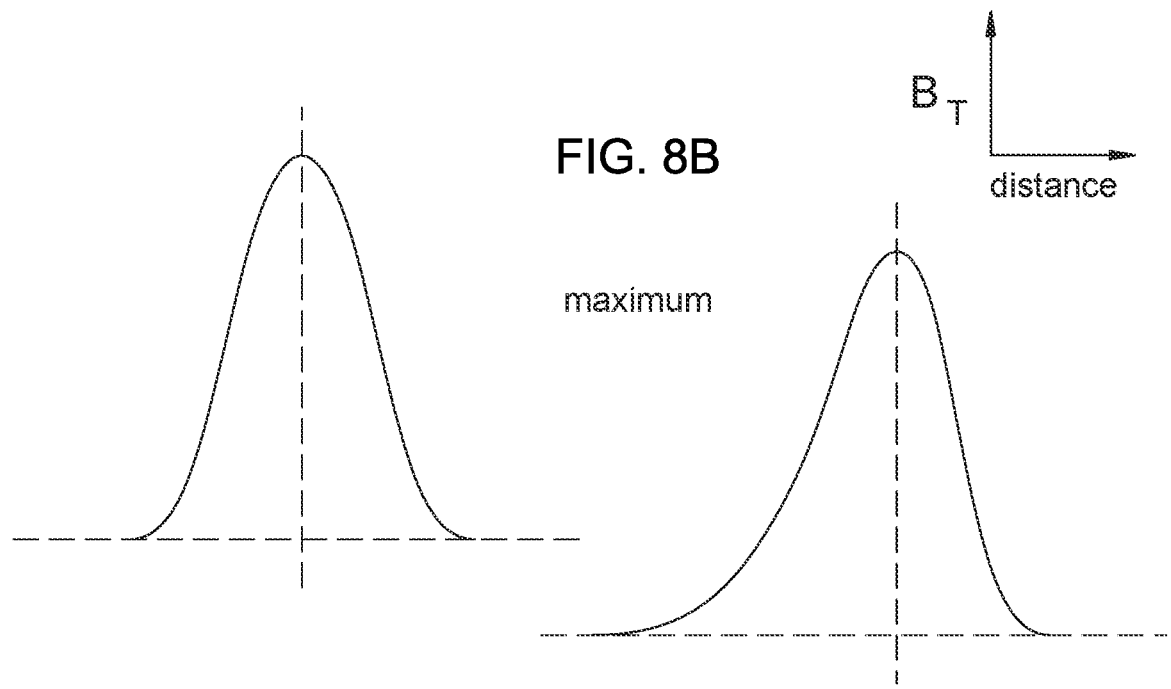
Figure 8C:
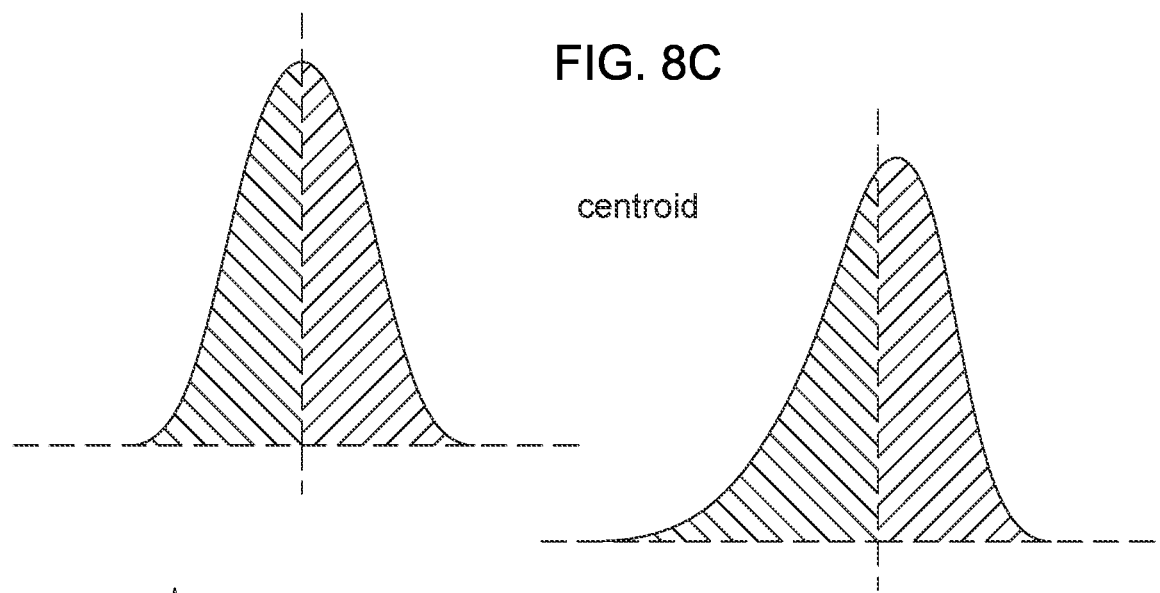
Figure 11A:
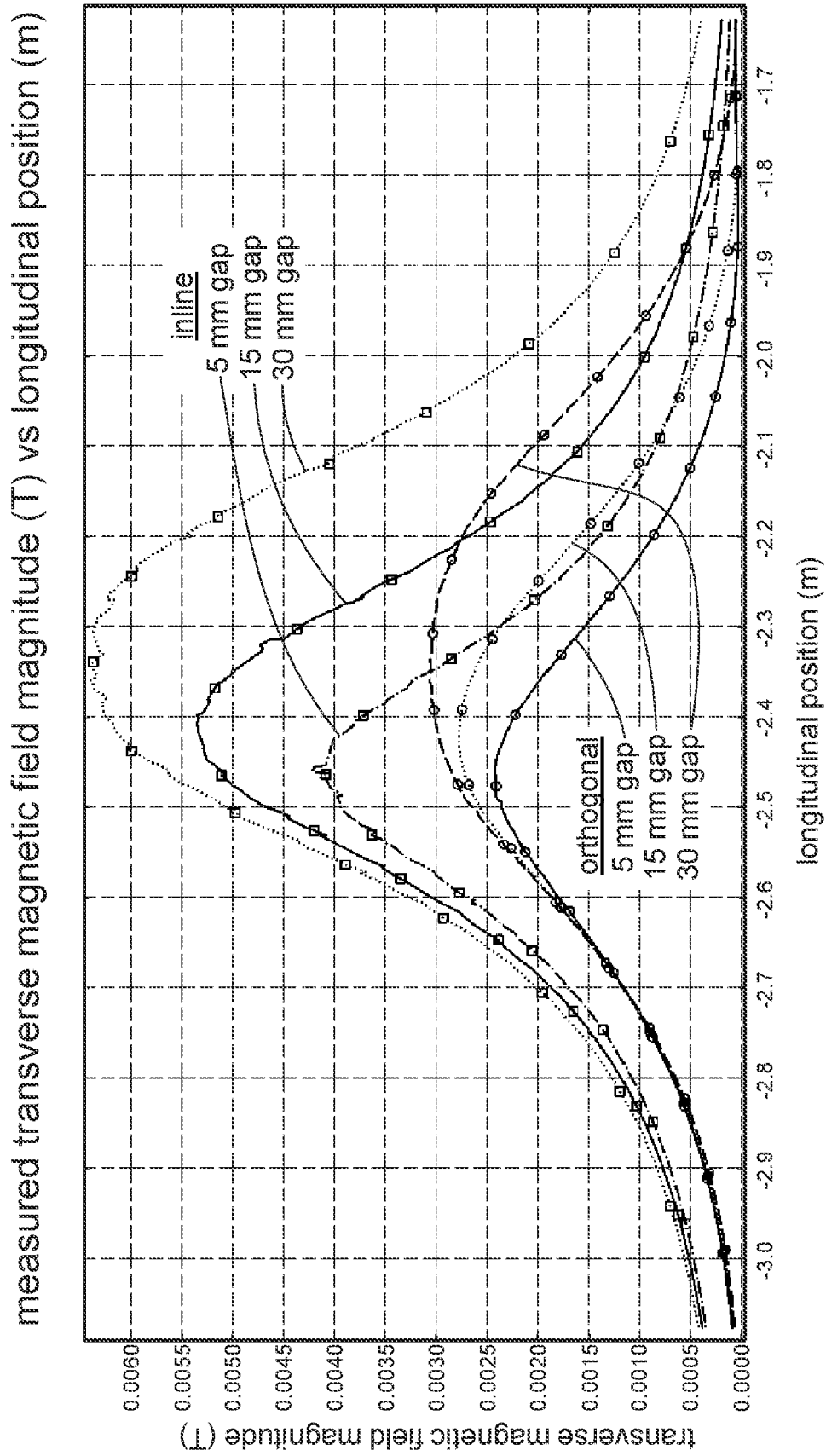
FIG. 11A includes plots of simulated transverse magnetic field magnitude as a function of sensor longitudinal position for different gap lengths, measured at circumferential sensor locations in line with (upper curves) and orthogonal to (lower curves) an off-center position of a simulated current segment spanning the gap.
Figure 11B:
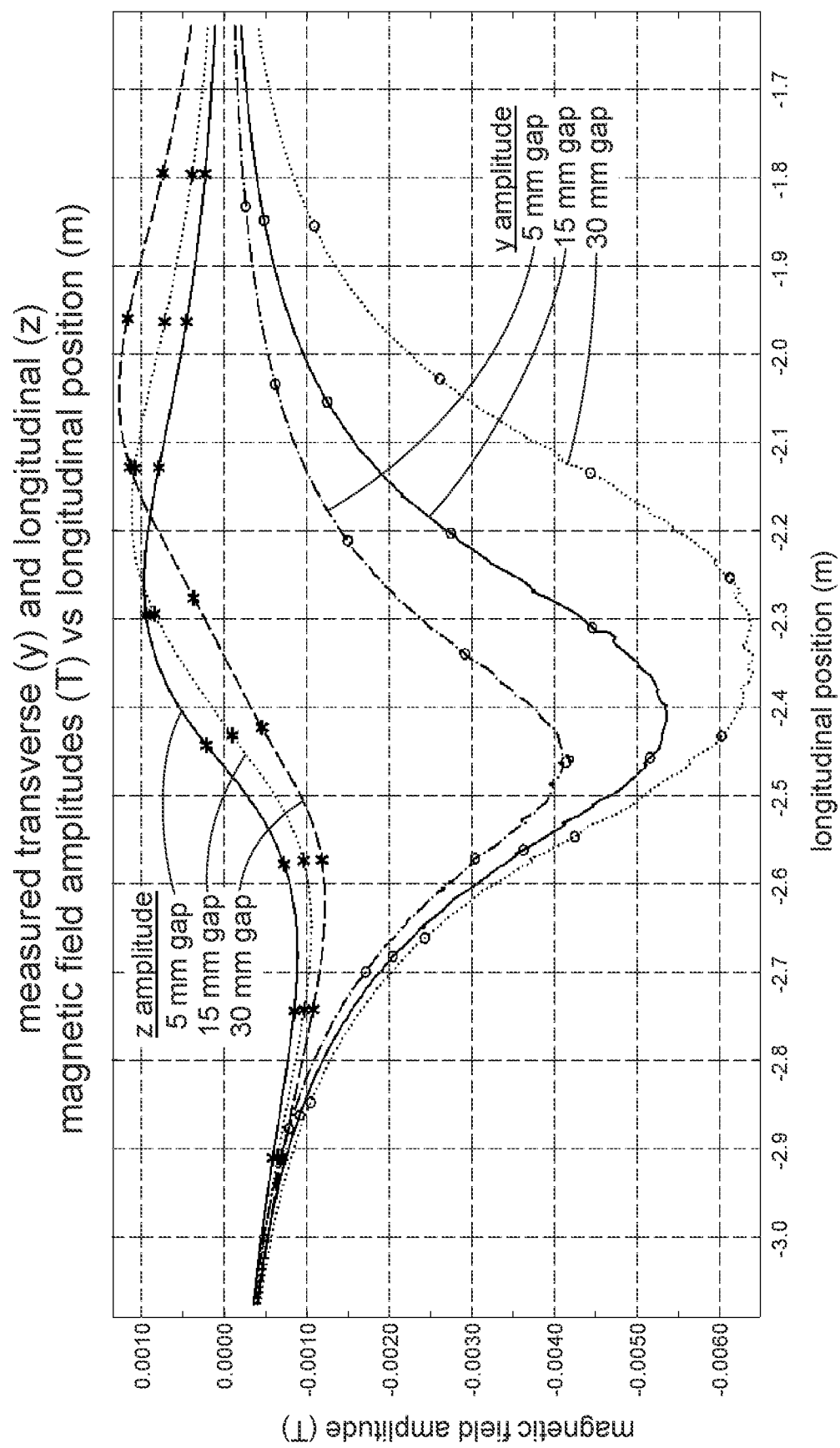
Fig. 11B includes plots of simulated transverse and longitudinal magnetic field amplitudes as a function of sensor longitudinal position for different gap lengths.

In some examples, the magnitude of a transverse magnetic field component (labelled as BT in the drawings), measured as a function of longitudinal position along the sensing volume 10, exhibits a local maximum at or near the longitudinal position of the gap 115 (e.g., as in the schematic representations of FIGS. 8A through 8C and the example simulation data plotted in FIG. 11A and the lower curves of FIG. 11B); the measurement of that functional dependence can be repeated as the gap 115 moves through the sensing volume 10 to track that movement. In some of those examples, calculation of an estimated length parameter at the transverse location of at least one of the current segments 30 is based at least in part on longitudinal distance across that maximum (e.g., note the increasing widths of the curves in FIG. 11A and the lower curves in FIG. 11B as the arc gap increases). In some examples, functional dependence can be relatively symmetric about its maximum; in some other examples, the functional dependence is asymmetric with respect to its maximum. In some examples, a specified fractional width at a specified fraction of the maximum magnitude of the measured transverse field component relative to a background level (e.g., full-width-at-half-maximum, half-width-at-quarter-maximum, or other suitable fractions) can be calculated as the estimated length parameter (e.g., as in the examples of FIG. 8A); in some examples, an Nth central moment of the measured transverse field component, where N is an integer greater than 1, can be calculated as the estimated length parameter; other suitable length parameters can employed. In some examples, the estimated longitudinal position of the gap 115 can be calculated as the longitudinal position of the maximum measured transverse field component (e.g., as in the examples of FIGS. 8B), or as the longitudinal position of a centroid of the measured transverse field component (e.g., as in the examples of FIG. 8C); other suitable calculations of the estimated longitudinal position can be employed.

Figure 9A:
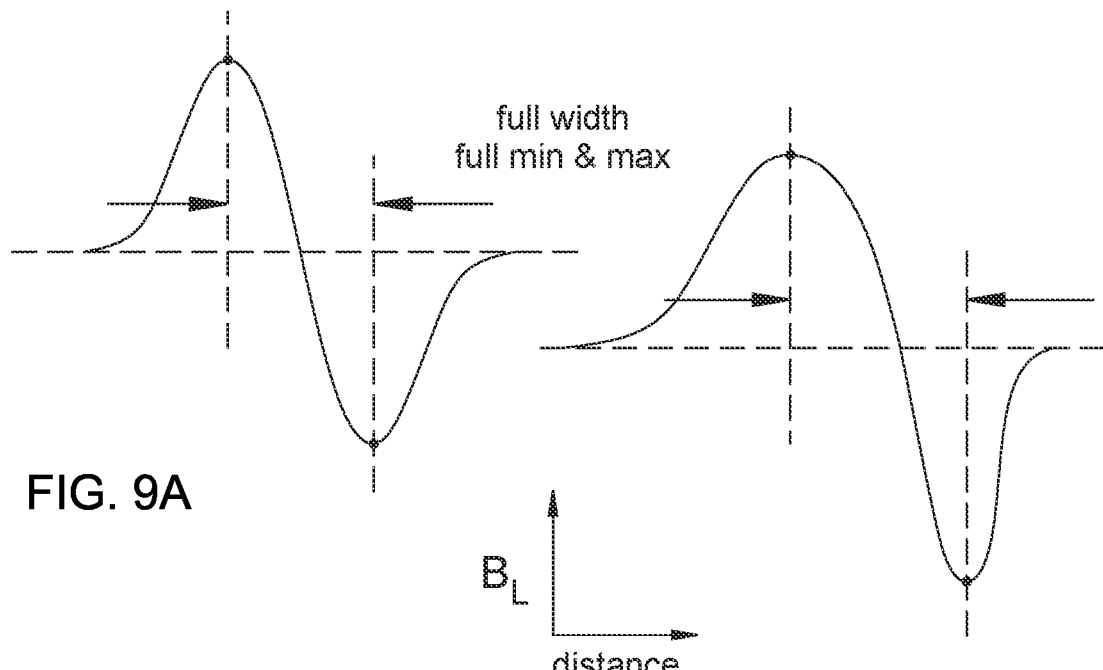
FIGS. 9A through 9F illustrate several examples of functional dependence of a longitudinal magnetic field component on sensor longitudinal position across the gap, and example calculations of longitudinal position or length parameter of a current segment spanning the gap.
Figure 9B:
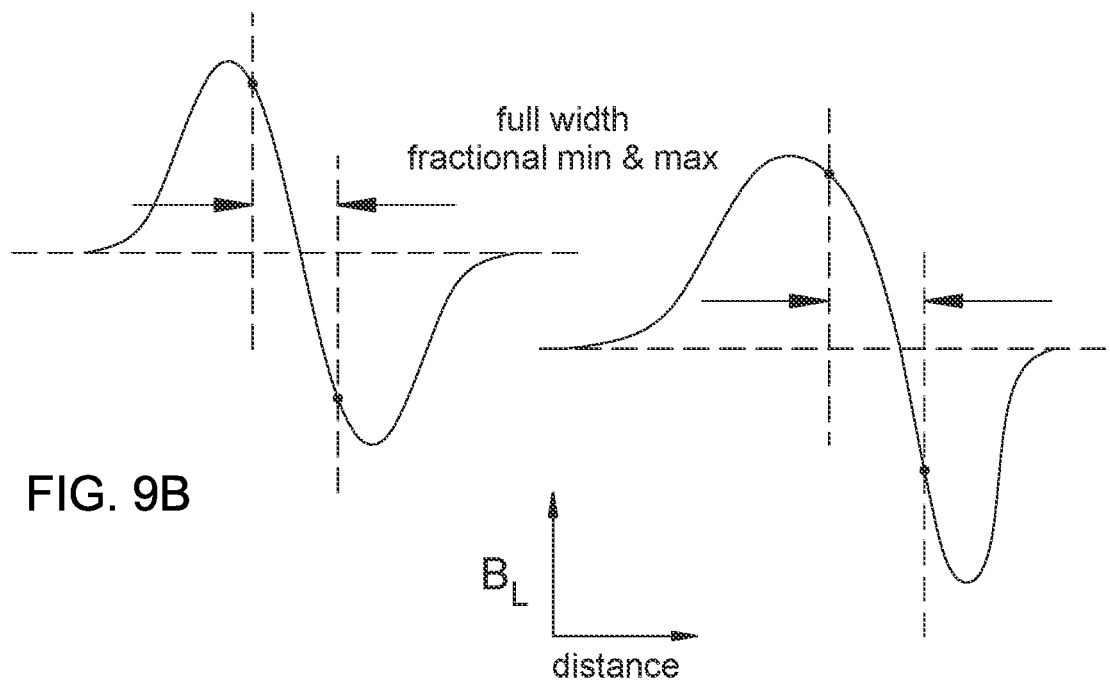
Figure 9C:
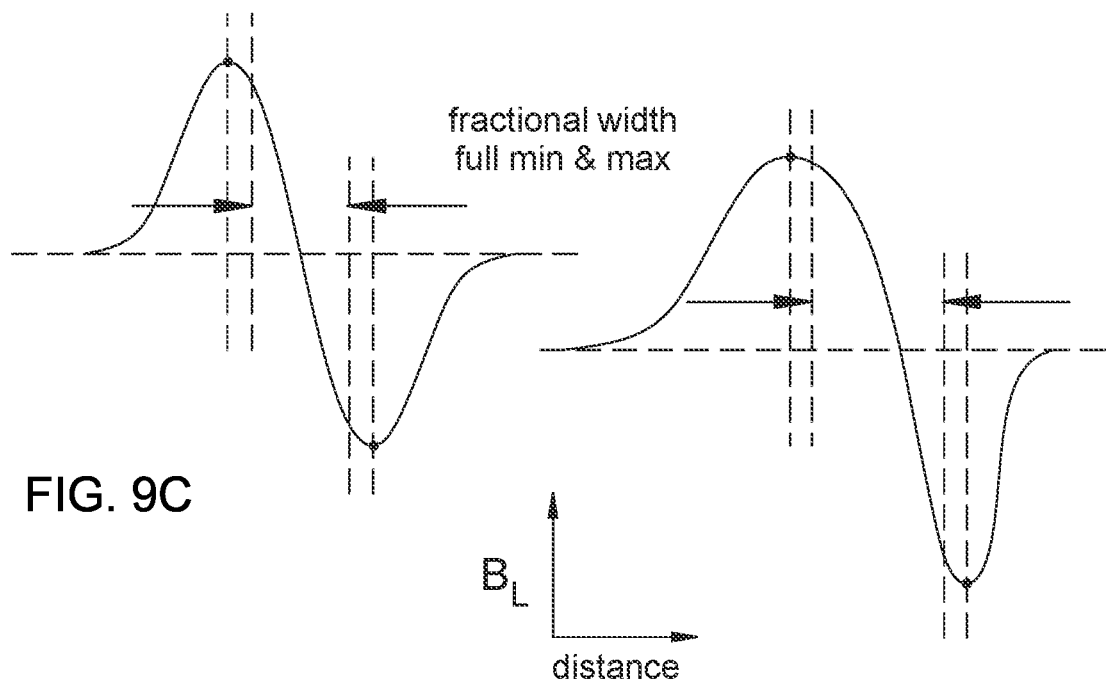
Figure 9D:
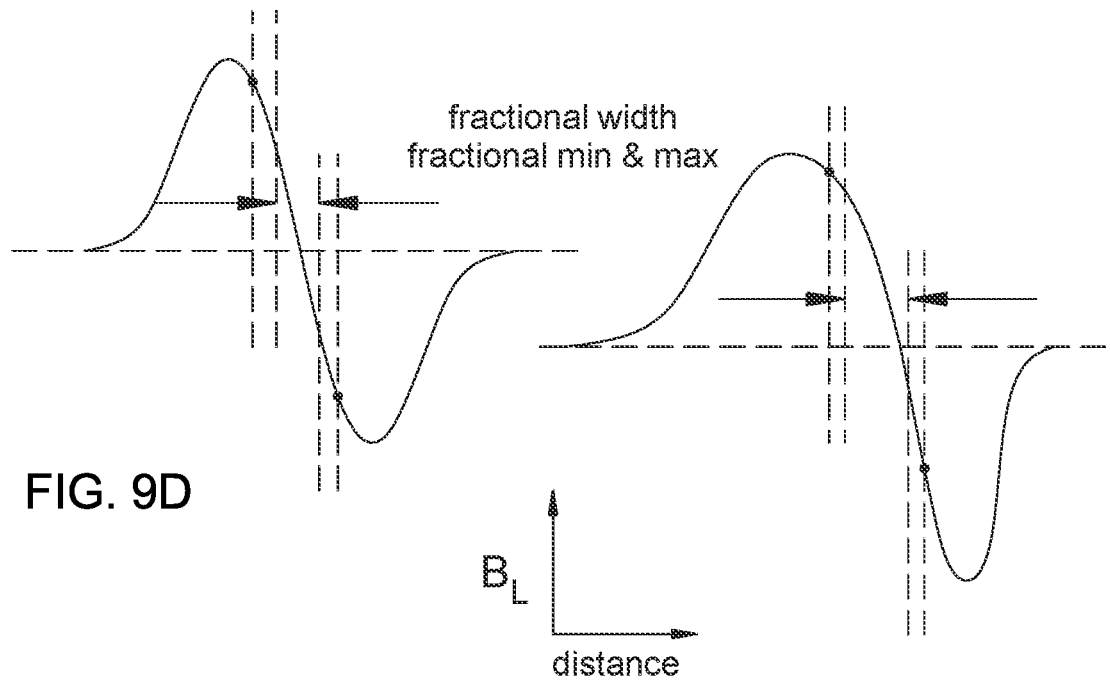
Figure 9E:
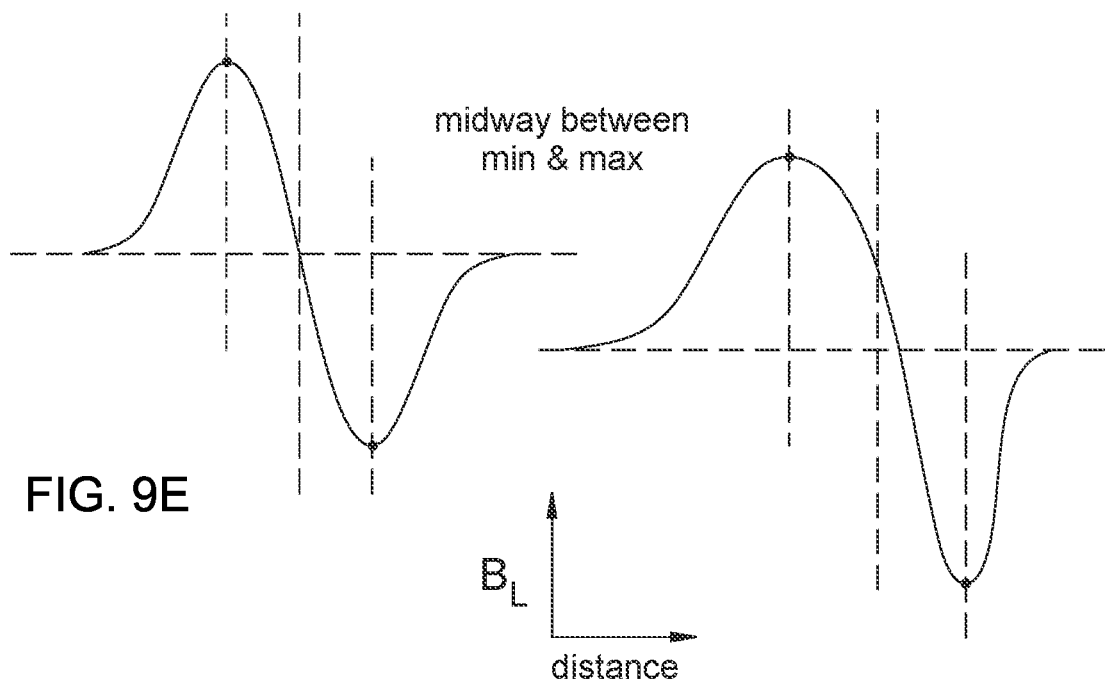
Figure 9F:
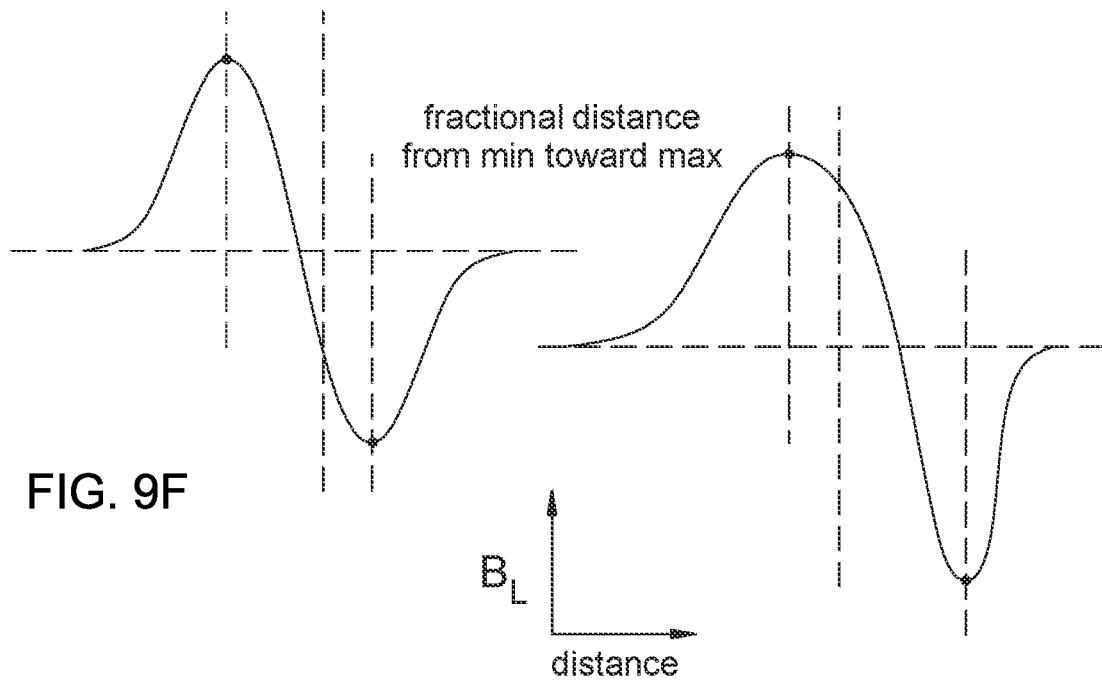

In some examples, a longitudinal magnetic field component (labelled as $B_L$ in the drawings), measured as a function of longitudinal position along the sensing volume 10, exhibits a local minimum and a local maximum at or near the longitudinal position of the gap 115 (e.g., as in the schematic representations of FIGS. 9A through 9F and the example simulation data plotted in the upper curves of FIG. 11B); the measurement of that functional dependence can be repeated as the gap 115 moves through the sensing volume 10 to track that movement. In some of those examples, calculation of an estimated length parameter at the transverse location of at least one of the current segments 30 is based at least in part on longitudinal distance across or between the maximum and minimum (e.g., note the increasing widths of the upper curves in FIG. 11B as the arc gap increases). In some examples, the functional dependence is relatively symmetric, exhibiting a minimum and a maximum that are substantially the same width and substantially the same amplitude (relative to a background level); in some other examples, the functional dependence is relatively asymmetric, exhibiting a minimum that differs from the maximum with respect to width or amplitude or both. In some examples, calculation of an estimated length parameter at the transverse location of at least one of the current segments 30 is based at least in part on longitudinal distance between the maximum and minimum. In some examples (e.g., as in the examples of FIG. 9A), the full distance between the full minimum and the full maximum can be employed. In some examples (e.g., as in the examples of FIG. 9B), the full distance between a specified fraction of the minimum and a specified fraction of the maximum, relative to a background level, can be employed (e.g., distance between 60% of the minimum and 75% of the maximum, or other specified fractions). In some examples (e.g., as in the examples of FIG. 9C), a specified fraction of the distance between the full minimum and the full maximum can be employed (e.g., 80% of the distance, or other specified fraction). In some examples (e.g., as in the examples of FIG. 9D), a specified fraction of the distance between a specified fraction of the minimum and a specified fraction of the maximum, relative to a background level, can be employed (e.g., 85% of the distance between 70% of the minimum and 65% of the maximum, or other specified fractions). Other suitable length parameters can be employed. In some examples, the estimated longitudinal position of the gap 115 can be calculated as a longitudinal position midway between the maximum and the minimum (e.g., as in the example of FIG. 9E), or at another specified fraction of the longitudinal distance between the maximum and minimum (e.g., from the minimum, 45% (or other specified fraction) of the longitudinal distance between the minimum and maximum; e.g., as in the examples of FIG. 9F). Other suitable calculations of the estimated longitudinal position can be employed.

There are many choices of which one or more field components to measure, which calculations to use for estimated longitudinal gap position, and which calculations to use for the estimated length parameter. Many examples are discussed above, and others can be employed as well. Which choices work optimally or adequately can vary depending on the environment in which the measurements are made. Among remelting furnaces, for example, the choice in some examples can depend on the particular geometry of the crucible 101 or electrode 110, one or materials used to construct various parts of the furnace 100, number or arrangement of sensors 200/201, the metal being remelted, or other factors. In some examples some experimentation can be employed to decide which field components to measure or which calculations or estimates to employ. In some examples, even after those choices are made, calibration procedures may be needed to fully characterized operation of a particular furnace 100 with the inventive measurement and control system.

In some examples, for each measured magnetic field component used in a given calculation of the estimated length parameter(s) of the one or more current segments 30, the corresponding longitudinal positions along the sensing volume 10 at which those magnetic field components are measured can span a longitudinal range along the sensing volume 10 greater than about two, three, five, or ten times a selected target distance across the gap 115 (e.g., a five inch span of measurements for five times a one inch gap target distance; other spans or ranges can be employed). In some of those examples, the selected target distance is greater than about 0.25 inches, greater than about 0.5 inches, greater than about 1.0 inch, greater than about 2.0 inches, or greater than about 5 inches; in some of those examples, the longitudinal range is greater than about 0.5 inches, greater than about 1.0 inch, greater than about 2.0 inches, greater than about 5 inches, greater than about 10. inches, greater than about 20. inches, or greater than about 30. inches. In some examples, for each measured magnetic field component used in a given calculation of the estimated length parameter(s) of the one or more current segments 30, the corresponding longitudinal positions along the sensing volume 10 at which those magnetic field components were measured are longitudinally spaced apart by a longitudinal spacing that is less than about one-half, one-third, one-fifth, or one-tenth of a selected target distance across the gap (e.g., 0.2 inch measurement spacing for one-fifth of a one inch gap target distance; other spacings can be employed). In some of those examples, the selected target distance is greater than about 0.25 inches, greater than about 1.0 inch, or greater than about 6 inches; in some of those examples, the longitudinal spacing is less than about 0.10 inches, 0.20 inches, 0.30 inches, 0.5 inches, 1.0 inches, or 2.0 inches.

In some examples, each measurement of one or more magnetic field components as a function of longitudinal position can be done using one of the movable sensors 200 that moves across the selected range of longitudinal positions and measures the magnetic field components at multiple different longitudinal positions. In such an arrangement, that movable sensor 200 typically would scan back-and-forth across the estimated longitudinal position of the gap 115. Frequency of the oscillatory motion typically should be high enough that the gap 115 does not move very far (e.g., less than the estimated gap distance, or less than half that distance, or less than one-tenth of that distance, or another suitable fractional distance) during any single scan across the gap position. Frequency of measurements typically should be high enough to result in suitable spacing of the measurement positions (e.g., as described in the preceding paragraph). Range of the scans typically should be large enough to result in a suitable range of measurement positions (e.g., as described in the preceding paragraph). A greater span or smaller spacing yields greater accuracy, but requires longer or faster movement or faster measurement by the scanning movable sensor 200. The center of the oscillatory motion of the scanning sensor 200 typically would move along the sensing volume 10 to track movement of the gap 115.

In some examples, each measurement of one or more magnetic field components as a function of longitudinal position can be done using a set of multiple movable sensors 200 positioned across the selected range of longitudinal positions so that each measures the magnetic field components at only one corresponding longitudinal position that is different from the other (so-called multichannel sensing). The spacing of the movable sensors 200 typically should be small enough to result in suitable spacing of the measurement positions (e.g., as described above). Range of positions of the movable sensors 200 typically should be large enough to result in a suitable range of measurement positions (e.g., as described above). A greater span or smaller spacing yields greater accuracy, but requires more movable sensors 200.

In addition to the magnetic field component measurements described above, other measurements or parameters can be incorporated into calculation of estimated longitudinal position(s) or length(s) of the one or more current segments 30. In some examples, calculation can be based at least in part on total current flowing through the sensing volume (e.g., monitoring average current or detecting transient current spikes due to drip shorts). In some examples, calculation can be based at least in part on a voltage difference between the first and second conductive bodies 110/120 (e.g., monitoring average voltage or detecting transient voltage drops due to drip shorts). In some examples, calculation can be based at least in part on measured weight of one or both of the first or second conductive bodies 110/102 (e.g., using a load cell to monitor the decreasing weight of the melting electrode 110 in a remelting furnace 110). In some examples, calculation can be based at least in part on measured longitudinal position of one or both of the first or second conductive bodies 110/120 provided by one or more corresponding actuators 130 arranged for moving one or both of the first or second conductive bodies 110/120 (discussed further below). In some examples, calculation can be based at least in part on measured longitudinal position of one or both of the first or second conductive bodies provided by an optical range finder or an optical position sensor. Any of those additional measurements or parameters can be included in a melt-time profile that is generated and stored for an ingot 120 produce by a remelting process.

Monitoring and recording the length parameter of a current segment 30 during a remelting process is useful for characterization or quality control of the resulting ingot 120. Controlling that length parameter during the remelting process provides an opportunity to improve quality and/or uniformity of that ingot 120. Accordingly, in some examples the inventive apparatus can further include a conductive-member actuator 130 operatively coupled to the computer system 299. In the examples shown in FIGS. 6A/6B, 7A/7B, and 10A/10B, the conductive-member actuator 130 is arranged for moving the first conductive member 110 (e.g., the electrode 110 of the remelting furnace 100) longitudinally within the sensing volume 10, under direction of control signals generated by and transmitted from the computer system 299. The actuator 130 can be of any suitable type or arrangement, including those listed above. Longitudinal movement of the conductive member 110 alters the distance across the gap 115 and the lengths of the one or more current segments 30. The computer system 299 can direct the conductive-member actuator 130 to position the first conductive member so that the estimated length parameter(s) (calculated in any of the ways described above) of the one or more current segments 30 are within a selected range of length parameter(s). In some examples, the computer system can couple the conductive-member actuator 130 and one or more of the movable sensors 200 in a servomechanism arrangement so as to maintain the estimated length parameter(s) (calculated in any of the ways described above) of the one or more current segments 30 within the selected range of length parameter(s). Such a servomechanism arrangement can be advantageously employed in a remelting furnace to maintain a consistent length parameter as the electrode 110 melts, the ingot 120 grows, and the gap 115 moves longitudinally through the furnace 100.

In some examples, one or more calculations of corresponding length parameter(s), longitudinal position(s), or transverse position(s) of the one or more current segments 30 can include corrections for magnetic field components arising from external conductors carrying the electric current 20 into the sensing volume 10 through the first conductive body 110 or carrying the electric current 20 out of the sensing volume 10 through the second conductive body 120. In some examples, one or more calculations of corresponding length parameter(s), longitudinal position(s), or transverse position(s) of the one or more current segments 30 can include measured directional corrections to the orientations of the measured magnetic field components for one or more of the movable sensors 200 or stationary sensors 201. In some examples, one or more calculations of corresponding length parameter(s), longitudinal position(s), or transverse position(s) of the one or more current segments 30 can include measured corrections arising from external magnetic fields in which the sensing volume 10 is immersed (e.g., earth's magnetic field).

So-called side-arcing (between a side surface of the electrode 110 and a lateral wall 102 of the remelting furnace 100) is an undesirable occurrence. Accordingly, in some examples having two or more of the magnetic field sensors arranged to measure longitudinal magnetic field components, the computer system 299 can recognize measured magnetic field magnitudes or longitudinal components that are indicative side arcing (i.e., a secondary localized electric current segment flowing transversely between a conductive body 110/120 and the chamber wall 120). In some examples the computer system can calculate an estimated magnitude or an estimated position of the secondary localized electric current segment. In some examples that include magnetic field sources 300 and wherein the computer system 299 can recognize or measure side-arcing, the computer system 299 can generate, upon recognition of a side arc, control signals that cause the sources 300 to apply a corresponding applied magnetic field that results in reduction or elimination of the side arc.

Any of the example embodiments disclosed above can be modified to yield additional example embodiments by using only stationary magnetic field sensors 201 without any movable magnetic field sensors 200, provided that sufficiently many stationary sensors 201 are employed at sufficiently small sensor spacing. Such modification eliminates the need for sensor actuators, or any servomechanism arranged for controlling sensor position. In some such embodiments the computer system 299 can couple the conductive-member actuator 130 to the stationary sensors 201 in a servomechanism arrangement.

The systems and methods disclosed herein can be implemented as or with general or special purpose computers or servers or other programmable hardware devices programmed through software, or as hardware or equipment "programmed" through hard wiring, or a combination of the two. A "computer" or "server" can comprise a single machine or can comprise multiple interacting machines (located at a single location or at multiple remote locations). Computer programs or other software code, if used, can be implemented in tangible, non-transient, temporary or permanent storage or replaceable media, such as by including programming in microcode, machine code, network-based or web-based or distributed software modules that operate together, RAM, ROM, CD-ROM, CD-R, CD-R/W, DVD-ROM, DVD±R, DVD±R/W, hard drives, thumb drives, flash memory, optical media, magnetic media, semiconductor media, or any future computer-readable storage alternatives. Electronic indicia of a dataset can be read from, received from, or stored on any of the tangible, non-transitory computer-readable media mentioned herein.

In addition to the preceding, the following example embodiments fall within the scope of the present disclosure or appended claims:

Example 1. An apparatus for estimating corresponding length parameter(s) and longitudinal position(s) within a sensing volume of one or more transversely localized electric current segments, the apparatus comprising: (a) a computer system comprising one or more electronic processors and one or more digital storage media coupled thereto; (b) one or more magnetic field sensors movable longitudinally along a lateral periphery of the sensing volume through which an electric current flows in a generally longitudinal direction (i) through a first electrically conductive body at least partly within the sensing volume, (ii) through a second electrically conductive body at least partly within the sensing volume, and (iii) across a gap between the first and second conductive bodies as the one or more transversely localized electric current segments; and (c) one or more sensor actuators arranged so as to move the one or more movable sensors longitudinally along the sensing volume in response to sensor position control signals generated by and transmitted from the computer system, (d) wherein the computer system is (i) operatively coupled to the one or more movable sensors and to the one or more sensor actuators, (ii) structured and connected so as to receive signals from the one or more sensor actuators indicative of corresponding longitudinal positions of the one or more movable sensors along the sensing volume and signals from the one or more movable sensors indicative of the corresponding magnetic field components measured by the one or more movable sensors, and (iii) structured, connected, and programmed so as to generate, and transmit to the one or more sensor actuators, the sensor position control signals, and (e) wherein the computer system is structured, connected, and programmed so as to calculate corresponding estimated length parameter(s) and longitudinal position(s) of the one or more current segments, that calculation being based at least in part on (i) magnetic field components measured at multiple different longitudinal positions along the sensing volume and (ii) for each of those measured magnetic field components, a corresponding longitudinal position along the sensing volume at which that magnetic field component was measured by a corresponding one of the one or more movable sensors.

Example 2. The apparatus of Example 1 wherein at least one of the current segments is an electric discharge or arc formed across the gap between the first and second conductive bodies.

Example 3. The apparatus of any one of Examples 1 or 2 wherein at least one of the current segments is a transient short circuit through a droplet of molten metal that drips across the gap between the first and second conductive bodies.

Example 4. The apparatus of any one of Examples 1 through 3 wherein at least one of the current segments flows through a conductive rod or wire connecting the first and second conductive bodies across the gap, the rod or wire having a transverse cross-sectional area that is less than a transverse cross-sectional area of the first or second conductive bodies.

Example 5. The apparatus of Example 4 wherein the transverse cross-sectional area of the rod or wire is less than about 0.5 times, less than about 0.25 times, less than 0.10 times, less than 0.05 times, less than about 0.01 times, less than about 0.005 times, or less than about 0.0010 times the cross-sectional area of the first or second conductive bodies.

Example 6. The apparatus of any one of Examples 1 through 5 wherein: (i) longitudinal position(s) of the one or more current segments are about equal to a longitudinal position within the sensing volume of the gap between the first and second conductive bodies, and length(s) of the one or more current segments are about equal to corresponding distance(s) across the gap between the first and second conductive bodies at corresponding transverse position(s) within the gap of the one or more current segments; and (ii) the computer system is structured, connected, and programmed so as to calculate corresponding estimated transverse position(s) within the gap of the one or more current segments based at least in part on (i) magnetic field components measured at multiple different circumferential positions around at least a portions of the lateral periphery of the sensing volume and (ii) for each of those measured magnetic field components, a corresponding circumferential position around the sensing volume at which that magnetic field component was measured.

Example 7. The apparatus of Example 6 wherein distance across the gap is substantially invariant with respect to transverse position.

Example 8. The apparatus of Example 6 wherein distance across the gap varies with transverse position.

Example 9. The apparatus of any one of Examples 1 through 8 wherein the one or more movable sensors include movable sensors positioned at multiple different circumferential positions around at least a portion of the lateral periphery of the sensing volume.

Example 10. The apparatus of any one of Examples 1 through 9 further comprising multiple stationary magnetic field sensors positioned at multiple different circumferential positions around at least a portion of the lateral periphery of the sensing volume.

Example 11. The apparatus of Example 10 wherein the stationary sensors include one or more rings of stationary sensors, and wherein each ring of stationary sensors includes multiple stationary sensors positioned at substantially the same longitudinal position along the sensing volume and at multiple different circumferential positions around the lateral periphery of the sensing volume.

Example 12. The apparatus of Example 11 wherein the stationary sensors include two or more rings of stationary sensors, and wherein the corresponding longitudinal position along the sensing volume of each ring of stationary sensors differs from that of at least one other ring of stationary sensors.

Example 13. The apparatus of any one of Examples 6 through 12 wherein the computer system is structured, connected, and programmed so as to calculate an estimated transverse topography of the gap between the first and second conductive bodies based on estimated length parameters and positions of one or more current segments at multiple different estimated transverse positions within the gap.

Example 14. The apparatus of any one of Examples 6 through 13 further comprising one or more magnetic field sources (i) operatively coupled to the computer system, (ii) positioned at the lateral periphery of the sensing volume, and (iii) arranged so as to apply, in response to control signals generated by and transmitted from the computer system, a corresponding applied magnetic field having a corresponding non-zero component directed transversely across at least a portion of the sensing volume that includes the gap between the first and second conductive members, wherein the computer system is structured, connected, and programmed so as to so as to generate, and transmit to the one or more sources, the corresponding control signals, based at least in part on the estimated transverse position of the one or more current segments and one or more corresponding source positions, so that the resulting applied magnetic fields control or alter the estimated transverse position of the one or more current segments according to a selected transverse position, transverse trajectory, or transverse distribution for the one or more current segments.

Example 15. The apparatus of Example 14 wherein the computer system is structured, connected, and programmed so as to (i) transmit to the one or more sources control signals that result in movement of the one or more currents segments among multiple estimated transverse positions and (ii) calculate an estimated transverse topography of the gap between the first and second conductive bodies based on estimated length parameters and positions of one or more current segments at the multiple different estimated transverse positions.

Example 16. The apparatus of any one of Examples 14 or 15 wherein the computer system couples one or more of the magnetic field sources and one or more of the magnetic field sensors in a servomechanism arrangement.

Example 17. The apparatus of any one of Examples 1 through 16 wherein (i) the sensing volume includes an interior volume of a crucible of a remelting furnace, (ii) the first conductive body is an electrode of the remelting furnace, (iii) the second conductive body is an ingot formed in the crucible of the remelting furnace by melting of the electrode, and (iv) the one or more movable sensors and the one or more sensor actuators are positioned outside crucible of the remelting furnace.

Example 18. The apparatus of Example 17 wherein at least one of the one or more current segments is a transient short circuit through a droplet of molten metal that drips across the gap from the electrode into a melt pool on a top surface of the ingot.

Example 19. The apparatus of any one of Examples 17 or 18 wherein at least one of the one or more current segments is an electric discharge or arc formed across the gap between the electrode and the ingot.

Example 20. The apparatus of any one of Examples 17 or 18 wherein a layer of molten slag at least partially fills the gap between the electrode and the ingot, and the one or more current segments pass through the slag layer.

Example 21. The apparatus of any one of Examples 17 through 20 wherein the computer system is structured and connected so as to generate and store a profile of estimated longitudinal position(s) and length parameter(s) of the one or more current segments as a function of melt time for a remelting process and associating that stored profile with the ingot produced by that remelting process.

Example 22. The apparatus of any one of Examples 1 through 21 wherein the computer system is structured, connected, and programmed so as to direct one or more of the one or more sensor actuators to position at least one of the one or more movable sensors within a selected longitudinal distance limit of an estimated longitudinal position of the gap between the first and second conductive bodies.

Example 23. The apparatus of Example 22 wherein the computer system couples one or more of the one or more sensor actuators and one or more of the one or more movable sensors in a servomechanism arrangement so as to maintain the longitudinal position of at least one of the movable sensors within the selected longitudinal distance limit of the estimated longitudinal position of the gap.

Example 24. The apparatus of any one of Examples 22 or 23 wherein the computer system is structured, connected, and programmed so as to direct two or more of the sensor actuators to position two or more of the movable sensors so that the estimated longitudinal position of the gap between the first and second conductive bodies is between corresponding longitudinal positions of at least two of those two or more movable sensors.

Example 25. The apparatus of any one of Examples 22 through 24 wherein two or more of the movable sensors and two or more of the sensor actuators are arranged, and the computer system is structured, connected, and programmed, so that longitudinal movements of those two or more movable sensors are independent of one another.

Example 26. The apparatus of any one of Examples 22 through 25 wherein two or more of the movable sensors are attached to a sensor platform that is movable in a longitudinal direction along the sensing volume, and the one or more sensor actuators include a platform actuator operatively coupled to the computer system and structured and connected so as to move the sensor platform longitudinally along the sensing volume under direction of control signals generated by and transmitted from the computer system.

Example 27. The apparatus of Example 26 wherein at least one of the movable sensors attached to the sensor platform is substantially rigidly attached to the sensor platform.

Example 28. The apparatus of any one of Examples 26 or 27 wherein at least one of the movable sensors attached to the platform is movable along the platform in the longitudinal direction.

Example 29. The apparatus of any one of Examples 26 through 28 wherein two or more of the movable sensors are attached to the sensor platform at corresponding different longitudinal positions along the sensor platform.

Example 30. The apparatus of any one of Examples 26 through 29 wherein the movable sensors attached to the sensor platform include one or more rings of movable sensors attached to the sensor platform, and wherein each ring of movable sensors includes multiple movable sensors attached at substantially the same longitudinal position along the sensor platform and at multiple different circumferential positions around the sensor platform.

Example 31. The apparatus of Example 30 wherein the movable sensors attached to the sensor platform include two or more rings of movable sensors attached to the sensor platform, and wherein the corresponding longitudinal position along the sensor platform of each ring of movable sensors differs from that of at least one other ring of movable sensors.

Example 32. The apparatus of any one of Examples 26 through 31 wherein two or more of the movable sensors are attached to the sensor platform at corresponding different circumferential positions around at least a portion of the lateral periphery of the sensing volume.

Example 33. The apparatus of any one of Examples 26 through 32 wherein the computer system is structured, connected, and programmed so as to direct the platform actuator to position the sensor platform so that the longitudinal position of at least one of the movable sensors attached to the sensor platform is within the selected longitudinal distance limit of the estimated longitudinal position of the gap.

Example 34. The apparatus of any one of Examples 26 through 33 wherein the computer system couples the platform actuator and one or more of the movable sensors attached to the sensor platform in a servomechanism arrangement so as to maintain the longitudinal position of at least one of the movable sensors attached to the platform within the selected longitudinal distance limit of the estimated longitudinal position of the gap.

Example 35. The apparatus of any one of Examples 22 through 34 wherein (i) the sensing volume includes an interior volume of a crucible of a remelting furnace, (ii) the first conductive body is an electrode of the remelting furnace, (iii) the second conductive body is an ingot formed in the crucible of the remelting furnace by melting of the electrode, (iv) the one or more movable sensors and the one or more sensor actuators are positioned outside the crucible of the remelting furnace, and (v) the computer system is structured, connected, and programmed so as to direct the one or more of the one or more sensor actuators to move the one or more movable sensors so that at least one of the one or more movable sensors remains within the selected longitudinal distance limit of the estimated longitudinal position of the gap between the first and second conductive bodies as the electrode melts, the ingot grows, and the gap between the ingot and the electrode moves longitudinally through the furnace.

Example 36. The apparatus of any one of Examples 1 through 35 wherein the computer system is structured, connected, and programmed so as to calculate, based at least partly on corresponding transverse magnetic field components measured at two or more longitudinal positions along the sensing volume, the estimated length parameter(s) of the one or more current segments flowing across the gap between the first and second conductive members.

Example 37. The apparatus of Example 36 wherein magnitude of a transverse magnetic field component measured as a function of longitudinal position along the sensing volume exhibits a local maximum at or near the longitudinal position of the gap, and calculation of an estimated length parameter at the transverse location of at least one of the current segments is based at least in part on longitudinal distance across the maximum.

Example 38. The apparatus of Example 37 wherein an estimated longitudinal position of the gap is calculated as longitudinal position of the maximum measured transverse field component, or as longitudinal position of a centroid of the measured transverse field component.

Example 39. The apparatus of any one of Examples 37 or 38 wherein a specified fractional width at a specified fraction of the maximum magnitude of the measured transverse field component relative to a background level, or an Nth central moment of the measured transverse field component where N is an integer greater than 1, is calculated as the estimated length parameter.

Example 40. The apparatus of any one of Examples 1 through 39 wherein the computer system is structured, connected, and programmed so as to calculate, based at least partly on corresponding longitudinal magnetic field components measured at two or more longitudinal positions along the sensing volume, the estimated length parameter(s) of the one or more current segments flowing across the gap between the first and second conductive members.

Example 41. The apparatus of Example 40 wherein a longitudinal magnetic field component measured as a function of longitudinal position along the sensing volume exhibits a local minimum and a local maximum at or near the longitudinal position of the gap, and calculation of an estimated length parameter at the transverse location of at least one of the current segments is based at least in part on longitudinal distance between the maximum and minimum.

Example 42. The apparatus of Example 41 wherein an estimated longitudinal position of the gap is calculated as a longitudinal position midway between the maximum and the minimum, or at a specified fraction of the longitudinal distance between the maximum and minimum.

Example 43. The apparatus of any one of Examples 41 or 42 wherein a specified fraction of the longitudinal distance between the maximum and minimum, or a longitudinal distance between a specified fraction of the difference between the maximum and minimum, is calculated as the estimated length parameter.

Example 44. The apparatus of any one of Examples 1 through 43 wherein the computer system is structured, connected, and programmed so as to (i) direct scanning movement of at least one movable sensor that spans the gap and (ii) calculate, based at least partly on corresponding magnetic field components measured at two or more longitudinal positions along the sensing volume by the at least one scanning movable sensor, the estimated length parameters of the one or more current segments flowing across the gap between the first and second conductive members.

Example 45. The apparatus of any one of Examples 1 through 44 wherein the computer system is structured, connected, and programmed so as to calculate, based at least partly on corresponding magnetic field components measured at two or more longitudinal positions along the sensing volume by corresponding two or more of the movable sensors, the estimated length parameter(s) of the one or more current segments flowing across the gap between the first and second conductive members.

Example 46. The apparatus of any one of Examples 1 through 45 wherein the calculation of estimated longitudinal position(s) or length parameter(s) of the one or more current segments is based at least in part on total current flowing through the sensing volume.

Example 47. The apparatus of any one of Examples 1 through 46 wherein the calculation of estimated position(s) or length parameter(s) of the one or more current segments is based at least in part on a voltage difference between the first and second conductive bodies.

Example 48. The apparatus of any one of Examples 1 through 47 wherein the calculation of estimated longitudinal position(s) or length parameter(s) of the one or more current segments is based at least in part on measured weight of one or both of the first or second conductive bodies.

Example 49. The apparatus of any one of Examples 1 through 48 wherein the calculation of estimated longitudinal position(s) or length parameter(s) of the one or more current segments is based at least in part on measured longitudinal position of one or both of the first or second conductive bodies provided by one or more corresponding actuators arranged for moving one or both of the first or second conductive bodies.

Example 50. The apparatus of any one of Examples 1 through 49 wherein the calculation of estimated longitudinal position(s) or length parameter(s) of the one or more current segments is based at least in part on measured longitudinal position of one or both of the first or second conductive bodies provided by an optical range finder or an optical position sensor.

Example 51. The apparatus of any one of Examples 1 through 50 wherein each one of the movable sensors is arranged so as to measure magnetic field components in one spatial dimension, in two spatial dimensions, or in three spatial dimensions.

Example 52. The apparatus of any one of Examples 1 through 51 further comprising a conductive-member actuator operatively coupled to the computer system and arranged for moving the first conductive member longitudinally within the sensing volume, under direction of control signals generated by and transmitted from the computer system, and thereby altering the distance across the gap, and the lengths of the one or more current segments, between the first and second conductive members.

Example 53. The apparatus of Example 52 wherein the computer system is structured, connected, and programmed so as to direct the conductive-member actuator to position the first conductive member so that one or more corresponding estimated length parameters of the one or more current segments are within a selected range of length parameters.

Example 54. The apparatus of any one of Examples 52 or 53 wherein the computer system couples the conductive-member actuator and one or more of the movable sensors in a servomechanism arrangement so as to maintain the one or more corresponding estimated length parameters of the one or more current segments within the selected range of length parameters.

Example 55. The apparatus of any one of Examples 52 through 54 wherein (i) the sensing volume includes an interior volume of a crucible of a remelting furnace, (ii) the first conductive body is an electrode of the remelting furnace, (iii) the second conductive body is an ingot formed in the crucible of the remelting furnace by melting of the electrode, (iv) the one or more movable sensors and the one or more sensor actuators are positioned outside the crucible of the remelting furnace, and (v) the computer system is structured, connected, and programmed so as to direct the conductive-member actuator to move the first conductive member so that the estimated length parameter(s) of the one or more current segments remain within a selected range of length parameters as the electrode melts, the ingot grows, and the gap between the ingot and the electrode moves longitudinally through the furnace.

Example 56. The apparatus of any one of Examples 1 through 55 wherein, for each measured magnetic field component used in a given calculation of the estimated length parameter(s) of the one or more current segments, the corresponding longitudinal positions along the sensing volume at which those magnetic field components were measured span a longitudinal range along the sensing volume greater than about two, three, five, or ten times a selected target distance across the gap.

Example 57. The apparatus of any one of Examples 1 through 56 wherein the selected target distance is greater than about 0.25 inches, greater than about 0.5 inches, greater than about 1.0 inch, greater than about 2.0 inches, or greater than about 5 inches.

Example 58. The apparatus of any one of Examples 1 through 57 wherein the longitudinal range is greater than about 0.5 inches, greater than about 1.0 inch, greater than about 2.0 inches, greater than about 5 inches, greater than about 10. inches, greater than about 20. inches, or greater than about 30. inches.

Example 59. The apparatus of any one of Examples 1 through 58 wherein, for each measured magnetic field component used in a given calculation of the estimated length parameter(s) of the one or more current segments, the corresponding longitudinal positions along the sensing volume at which those magnetic field components were measured are longitudinally spaced apart by a longitudinal spacing that is less than about one-half, one-third, one-fifth, or one-tenth of a selected target distance across the gap.

Example 60. The apparatus of any one of Examples 1 through 59 wherein the selected target distance is greater than about 0.25 inches, greater than about 1.0 inch, or greater than about 6 inches.

Example 61. The apparatus of any one of Examples 1 through 60 wherein longitudinal spacing is less than about 0.10 inches, 0.20 inches, 0.30 inches, 0.5 inches, 1.0 inches, or 2.0 inches.

Example 62. The apparatus of any one of Examples 1 through 61 wherein, for a given calculation of the estimated length parameter(s) of the one or more current segments, at least one of the movable sensors moves across the range of longitudinal positions and measures the magnetic field components at multiple different longitudinal positions.

Example 63. The apparatus of any one of Examples 1 through 61 wherein, for a given calculation of the estimated length parameter(s) of the one or more current segments, field components measured at each longitudinal position are measured by corresponding movable sensor(s) different from the movable sensor(s) that measure field components other, different longitudinal positions.

Example 64. The apparatus of any one of Examples 1 through 63 wherein one or more calculations of corresponding length parameter(s), longitudinal position(s), or transverse position(s) of the one or more current segments include corrections for magnetic field components arising from external conductors carrying electric current into the sensing volume through the first conductive body or carrying electric current out of the sensing volume through the second conductive body.

Example 65. The apparatus of any one of Examples 1 through 64 wherein one or more calculations of corresponding length parameter(s), longitudinal position(s), or transverse position(s) of the one or more current segments include measured directional corrections to the orientations of the measured magnetic field components for one or more of the magnetic field sensors.

Example 66. The apparatus of any one of Examples 1 through 65 wherein one or more calculations of corresponding length parameter(s), longitudinal position(s), or transverse position(s) of the one or more current segments include measured corrections arising from external magnetic fields in which the sensing volume is immersed.

Example 67. The apparatus of any one of Examples 1 through 66 (i) further comprising a chamber that defines the lateral periphery of the sensing volume with the multiple sensors located outside the chamber, (ii) wherein two or more of the magnetic field sensors are arranged so as to measure a magnetic field component in a substantially longitudinal dimension, and (iii) wherein the computer system is structured, connected, and programmed so as to recognize one or more sets of measured magnetic field magnitudes or longitudinal components that are indicative of a secondary localized electric current segment flowing in a predominantly transverse direction between the first or second conductive body and the chamber, that recognition being based at least in part on magnitude of current, estimated longitudinal positions of the one or more current segments, and two or more of the measured longitudinal magnetic field components.

Example 68. The apparatus of Example 67 wherein the computer system is structured, connected, and programmed so as to calculate an estimated magnitude or an estimated position of the secondary localized electric current segment, that calculation being based at least in part on magnitude of current, estimated longitudinal positions of the one or more current segments, and two or more of the measured longitudinal magnetic field components.

Example 69. The apparatus of any one of Examples 67 or 68 further comprising one or more magnetic field sources (i) operatively coupled to the computer system, (ii) positioned at the lateral periphery of the sensing volume, and (iii) arranged so as to apply, in response to control signals generated by and transmitted from the computer system, a corresponding applied magnetic field having a corresponding non-zero component directed transversely across at least a portion of the sensing volume that includes the gap between the first and second conductive members, wherein the computer system is structured, connected, and programmed so as to generate a corresponding control signal, in response to recognition of one or more sets of measured magnetic field magnitudes or longitudinal components that are indicative of a secondary localized electric current segment flowing in a predominantly transverse direction between the first or second conductive body and the chamber, and transmitting that control signal to a corresponding one of the sources that results in reduction or elimination of one or more of the secondary localized electric current segments.

Example 70. A method, using the apparatus of any one of Examples 1 through 69, for estimating corresponding length parameter(s) and longitudinal position(s) of the one or more transversely localized electric current segments between the first and second electrically conductive bodies, the method comprising: (A) with the electric current flowing through the first and second conductive bodies, measuring magnetic field components at two or more longitudinal positions using the one or more movable sensors; (B) using the computer system, receiving signals from the one or more sensor actuators indicative of the longitudinal position(s) of one or more of the movable sensors along the sensing volume and signals from one or more of the movable sensors indicative of the corresponding measured magnetic field components; and (C) using the computer system, calculating corresponding estimated length parameter(s) and longitudinal position(s)s of the one or more current segments, that calculation being based at least in part on (i) magnetic field components measured at multiple different longitudinal positions along the sensing volume and (ii) for each of those measured magnetic field components, a corresponding longitudinal position along the sensing volume at which that magnetic field component was measured by a corresponding one of the one or more movable sensors.

It is intended that equivalents of the disclosed example embodiments and methods shall fall within the scope of the present disclosure or appended claims. It is intended that the disclosed example embodiments and methods, and equivalents thereof, may be modified while remaining within the scope of the present disclosure or appended claims.

In the foregoing Detailed Description, various features may be grouped together in several example embodiments for the purpose of streamlining the disclosure. This method of disclosure is not to be interpreted as reflecting an intention that any claimed embodiment requires more features than are expressly recited in the corresponding claim. Rather, as the appended claims reflect, inventive subject matter may lie in less than all features of a single disclosed example embodiment. Therefore, the present disclosure shall be construed as implicitly disclosing any embodiment having any suitable subset of one or more features—which features are shown, described, or claimed in the present application—including those subsets that may not be explicitly disclosed herein. A "suitable" subset of features includes only features that are neither incompatible nor mutually exclusive with respect to any other feature of that subset. Accordingly, the appended claims are hereby incorporated into the Detailed Description, with each claim standing on its own as a separate disclosed embodiment. In addition, each of the appended dependent claims shall be interpreted, only for purposes of disclosure by said incorporation of the claims into the Detailed Description, as if written in multiple dependent form and dependent upon all preceding claims with which it is not inconsistent. It should be further noted that the cumulative scope of the appended claims can, but does not necessarily, encompass the whole of the subject matter disclosed in the present application.

The following interpretations shall apply for purposes of the present disclosure and appended claims. The article "a" shall be interpreted as "one or more" unless "only one," "a single," or other similar limitation is stated explicitly or is implicit in the particular context; similarly, the article "the" shall be interpreted as "one or more of the" unless "only one of the," "a single one of the," or other similar limitation is stated explicitly or is implicit in the particular context. The conjunction "or" is to be construed inclusively (e.g., "a dog or a cat" would be interpreted as "a dog, or a cat, or both"; e.g., "a dog, a cat, or a mouse" would be interpreted as "a dog, or a cat, or a mouse, or any two, or all three"), unless: (i) it is explicitly stated otherwise, e.g., by use of "either . . . or," "only one of," or similar language; or (ii) two or more of the listed alternatives are mutually exclusive within the particular context, in which case "or" would encompass only those combinations involving non-mutually-exclusive alternatives. Similarly, "one or more of a dog or a cat" would be interpreted as including (i) one or more dogs without any cats, (ii) one or more cats without any dogs, or (iii) one or more dogs and one or more cats, unless explicitly stated otherwise or the alternatives are understood or disclosed (implicitly or explicitly) to be mutually exclusive or incompatible. Similarly, "one or more of a dog, a cat, or a mouse" would be interpreted as (i) one or more dogs without any cats or mice, (ii) one or more cats without and dogs or mice, (iii) one or more mice without any dogs or cats, (iv) one or more dogs and one or more cats without any mice, (v) one or more dogs and one or more mice without any cats, (vi) one or more cats and one or more mice without any dogs, or (vii) one or more dogs, one or more cats, and one or more mice. "Two or more of a dog, a cat, or a mouse" would be interpreted as (i) one or more dogs and one or more cats without any mice, (ii) one or more dogs and one or more mice without any cats, (iii) one or more cats and one or more mice without and dogs, or (iv) one or more dogs, one or more cats, and one or more mice; "three or more," "four or more," and so on would be analogously interpreted. For any of the preceding recitations, if any pairs or combinations of the included alternatives are understood or disclosed (implicitly or explicitly) to be incompatible or mutually exclusive, such pairs or combinations are understood to be excluded from the corresponding recitation. For purposes of the present disclosure and appended claims, the words "comprising," "including," "having," and variants thereof, wherever they appear, shall be construed as open ended terminology, with the same meaning as if a phrase such as "at least" were appended after each instance thereof, unless explicitly stated otherwise.

For purposes of the present disclosure or appended claims, when terms are employed such as "about equal to," "substantially equal to," "greater than about," "less than about," and so forth, in relation to a numerical quantity, standard conventions pertaining to measurement precision and significant digits shall apply, unless a differing interpretation is explicitly set forth. For null quantities described by phrases such as "substantially prevented," "substantially absent," "substantially eliminated," "about equal to zero," "negligible," and so forth, each such phrase shall denote the case wherein the quantity in question has been reduced or diminished to such an extent that, for practical purposes in the context of the intended operation or use of the disclosed or claimed apparatus or method, the overall behavior or performance of the apparatus or method does not differ from that which would have occurred had the null quantity in fact been completely removed, exactly equal to zero, or otherwise exactly nulled.

For purposes of the present disclosure and appended claims, any labelling of elements, steps, limitations, or other portions of an embodiment, example, or claim (e.g., first, second, third, etc., (a), (b), (c), etc., or (i), (ii), (iii), etc.) is only for purposes of clarity, and shall not be construed as implying any sort of ordering or precedence of the portions so labelled. If any such ordering or precedence is intended, it will be explicitly recited in the embodiment, example, or claim or, in some instances, it will be implicit or inherent based on the specific content of the embodiment, example, or claim. In the appended claims, if the provisions of 35 USC § 112(f) are desired to be invoked in an apparatus claim, then the word "means" will appear in that apparatus claim. If those provisions are desired to be invoked in a method claim, the words "a step for" will appear in that method claim. Conversely, if the words "means" or "a step for" do not appear in a claim, then the provisions of 35 USC § 112(f) are not intended to be invoked for that claim.

If any one or more disclosures are incorporated herein by reference and such incorporated disclosures conflict in part or whole with, or differ in scope from, the present disclosure, then to the extent of conflict, broader disclosure, or broader definition of terms, the present disclosure controls. If such incorporated disclosures conflict in part or whole with one another, then to the extent of conflict, the later-dated disclosure controls.

The Abstract is provided as required as an aid to those searching for specific subject matter within the patent literature. However, the Abstract is not intended to imply that any elements, features, or limitations recited therein are necessarily encompassed by any particular claim. The scope of subject matter encompassed by each claim shall be determined by the recitation of only that claim.

What is claimed is:

1. An apparatus for estimating corresponding length parameter(s) and longitudinal position(s) within a sensing volume of one or more transversely localized electric current segments, the apparatus comprising:
   (a) a computer system comprising one or more electronic processors and one or more digital storage media coupled thereto;
   (b) one or more magnetic field sensors movable longitudinally along a lateral periphery of the sensing volume through which an electric current flows in a generally longitudinal direction (i) through a first electrically conductive body at least partly within the sensing volume, (ii) through a second electrically conductive body at least partly within the sensing volume, and (iii) across a gap between the first and second conductive bodies as the one or more transversely localized electric current segments; and
   (c) one or more sensor actuators arranged so as to move the one or more movable sensors longitudinally along the sensing volume in response to sensor position control signals generated by and transmitted from the computer system,
   (d) wherein the computer system is (i) operatively coupled to the one or more movable sensors and to the one or more sensor actuators, (ii) structured and connected so as to receive signals from the one or more sensor actuators indicative of corresponding longitudinal positions of the one or more movable sensors along the sensing volume and signals from the one or more movable sensors indicative of the corresponding magnetic field components measured by the one or more movable sensors, and (iii) structured, connected, and programmed so as to generate, and transmit to the one or more sensor actuators, the sensor position control signals, and
   (e) wherein the computer system is structured, connected, and programmed so as to calculate corresponding estimated length parameter(s) and longitudinal position(s) of the one or more current segments, that calculation being based at least in part on (i) magnetic field components measured at multiple different longitudinal positions along the sensing volume and (ii) for each of those measured magnetic field components, a corresponding longitudinal position along the sensing volume at which that magnetic field component was measured by a corresponding one of the one or more movable sensors.

2. The apparatus of claim 1:
   (i) longitudinal position(s) of the one or more current segments are about equal to a longitudinal position within the sensing volume of the gap between the first and second conductive bodies, and length(s) of the one or more current segments are about equal to corresponding distance(s) across the gap between the first and second conductive bodies at corresponding transverse position(s) within the gap of the one or more current segments; and
   (ii) the computer system is structured, connected, and programmed so as to calculate corresponding estimated transverse position(s) within the gap of the one or more current segments based at least in part on (i) magnetic field components measured at multiple different circumferential positions around at least a portions of the lateral periphery of the sensing volume and (ii) for each of those measured magnetic field components, a corresponding circumferential position around the sensing volume at which that magnetic field component was measured.

3. The apparatus of claim 2 wherein the computer system is structured, connected, and programmed so as to calculate an estimated transverse topography of the gap between the first and second conductive bodies based on estimated length parameters and positions of one or more current segments at multiple different estimated transverse positions within the gap.

4. The apparatus of claim 2 further comprising one or more magnetic field sources (i) operatively coupled to the computer system, (ii) positioned at the lateral periphery of the sensing volume, and (iii) arranged so as to apply, in response to control signals generated by and transmitted from the computer system, a corresponding applied magnetic field having a corresponding non-zero component directed transversely across at least a portion of the sensing volume that includes the gap between the first and second conductive members, wherein the computer system is structured, connected, and programmed so as to so as to generate, and transmit to the one or more sources, the corresponding control signals, based at least in part on the estimated transverse position of the one or more current segments and one or more corresponding source positions, so that the resulting applied magnetic fields control or alter the estimated transverse position of the one or more current segments according to a selected transverse position, transverse trajectory, or transverse distribution for the one or more current segments.

5. The apparatus of claim 4 wherein the computer system couples one or more of the magnetic field sources and one or more of the magnetic field sensors in a servomechanism arrangement.

6. The apparatus of claim 1 wherein the one or more movable sensors include movable sensors positioned at multiple different circumferential positions around at least a portion of the lateral periphery of the sensing volume.

7. The apparatus of claim 1 further comprising multiple stationary magnetic field sensors positioned at multiple different circumferential positions around at least a portion of the lateral periphery of the sensing volume.

8. The apparatus of claim 1 wherein (i) the sensing volume includes an interior volume of a crucible of a remelting furnace, (ii) the first conductive body is an electrode of the remelting furnace, (iii) the second conductive body is an ingot formed in the crucible of the remelting furnace by melting of the electrode, and (iv) the one or more movable sensors and the one or more sensor actuators are positioned outside crucible of the remelting furnace.

9. The apparatus of claim 8 wherein (i) at least one of the one or more current segments is a transient short circuit through a droplet of molten metal that drips across the gap from the electrode into a melt pool on a top surface of the ingot, or (ii) at least one of the one or more current segments is an electric discharge or arc formed across the gap between the electrode and the ingot.

10. The apparatus of claim 8 wherein the computer system is structured and connected so as to generate and store a profile of estimated longitudinal position(s) and length parameter(s) of the one or more current segments as a function of melt time for a remelting process and associating that stored profile with the ingot produced by that remelting process.

11. The apparatus of claim 1 wherein the computer system is structured, connected, and programmed so as to direct one or more of the one or more sensor actuators to position at least one of the one or more movable sensors within a selected longitudinal distance limit of an estimated longitudinal position of the gap between the first and second conductive bodies.

12. The apparatus of claim 11 wherein the computer system couples one or more of the one or more sensor actuators and one or more of the one or more movable sensors in a servomechanism arrangement so as to maintain the longitudinal position of at least one of the movable sensors within the selected longitudinal distance limit of the estimated longitudinal position of the gap.

13. The apparatus of claim 1 wherein the computer system is structured, connected, and programmed so as to calculate, based at least partly on corresponding transverse magnetic field components measured at two or more longitudinal positions along the sensing volume, the estimated length parameter(s) of the one or more current segments flowing across the gap between the first and second conductive members, wherein magnitude of a transverse magnetic field component measured as a function of longitudinal position along the sensing volume exhibits a local maximum at or near the longitudinal position of the gap, and wherein (i) calculation of an estimated length parameter at the transverse location of at least one of the current segments is based at least in part on longitudinal distance across the maximum, or (ii) calculation of an estimated longitudinal position of the gap is based at least on part on a longitudinal position of the maximum measured transverse field component or a longitudinal position of a centroid of the measured transverse field component.

14. The apparatus of claim 1 wherein the computer system is structured, connected, and programmed so as to calculate, based at least partly on corresponding longitudinal magnetic field components measured at two or more longitudinal positions along the sensing volume, the estimated length parameter(s) of the one or more current segments flowing across the gap between the first and second conductive members, wherein a longitudinal magnetic field component measured as a function of longitudinal position along the sensing volume exhibits a local minimum and a local maximum at or near the longitudinal position of the gap, and wherein (i) calculation of an estimated length parameter at the transverse location of at least one of the current segments is based at least in part on longitudinal distance between the maximum and minimum, or (ii) an estimated longitudinal position of the gap is calculated as a longitudinal position midway between the maximum and the minimum, or at a specified fraction of the longitudinal distance between the maximum and minimum.

15. The apparatus of claim 1 wherein the computer system is structured, connected, and programmed so as to (i) direct scanning movement of at least one movable sensor that spans the gap and (ii) calculate, based at least partly on corresponding magnetic field components measured at two or more longitudinal positions along the sensing volume by the at least one scanning movable sensor, the estimated length parameters of the one or more current segments flowing across the gap between the first and second conductive members.

16. The apparatus of claim 1 wherein the computer system is structured, connected, and programmed so as to calculate, based at least partly on corresponding magnetic field components measured at two or more longitudinal positions along the sensing volume by corresponding two or more of the movable sensors, the estimated length parameter(s) of the one or more current segments flowing across the gap between the first and second conductive members.

17. The apparatus of claim 1 further comprising a conductive-member actuator operatively coupled to the computer system and arranged for moving the first conductive member longitudinally within the sensing volume, under direction of control signals generated by and transmitted from the computer system, and thereby altering the distance across the gap, and the lengths of the one or more current segments, between the first and second conductive members, wherein the computer system is structured, connected, and programmed so as to direct the conductive-member actuator to position the first conductive member so that one or more corresponding estimated length parameters of the one or more current segments are within a selected range of length parameters.

18. The apparatus of claim 17 wherein the computer system couples the conductive-member actuator and one or more of the movable sensors in a servomechanism arrangement so as to maintain the one or more corresponding estimated length parameters of the one or more current segments within the selected range of length parameters.

19. The apparatus of claim 1 wherein, for each measured magnetic field component used in a given calculation of the estimated length parameter(s) of the one or more current segments, the corresponding longitudinal positions along the sensing volume at which those magnetic field components were measured span a longitudinal range along the sensing volume greater than about two, three, five, or ten times a selected target distance across the gap.

20. The apparatus of claim 1 wherein, for each measured magnetic field component used in a given calculation of the estimated length parameter(s) of the one or more current segments, the corresponding longitudinal positions along the sensing volume at which those magnetic field components were measured are longitudinally spaced apart by a longitudinal spacing that is less than about one-half, one-third, one-fifth, or one-tenth of a selected target distance across the gap.

21. The apparatus of claim 1: (i) further comprising a chamber that defines the lateral periphery of the sensing volume with the multiple sensors located outside the chamber, (ii) wherein two or more of the magnetic field sensors are arranged so as to measure a magnetic field component in a substantially longitudinal dimension, and (iii) wherein the computer system is structured, connected, and programmed so as to recognize one or more sets of measured magnetic field magnitudes or longitudinal components that are indicative of a secondary localized electric current segment flowing in a predominantly transverse direction between the first or second conductive body and the chamber, that recognition being based at least in part on magnitude of current, estimated longitudinal positions of the one or more current segments, and two or more of the measured longitudinal magnetic field components.

22. The apparatus of claim 21 further comprising one or more magnetic field sources (i) operatively coupled to the computer system, (ii) positioned at the lateral periphery of the sensing volume, and (iii) arranged so as to apply, in response to control signals generated by and transmitted from the computer system, a corresponding applied magnetic field having a corresponding non-zero component directed transversely across at least a portion of the sensing volume that includes the gap between the first and second conductive members, wherein the computer system is structured, connected, and programmed so as to generate a corresponding control signal, in response to recognition of one or more sets of measured magnetic field magnitudes or longitudinal components that are indicative of a secondary localized electric current segment flowing in a predominantly transverse direction between the first or second conductive body and the chamber, and transmitting that control signal to a corresponding one of the sources that results in reduction or elimination of one or more of the secondary localized electric current segments.

23. A method, using the apparatus of claim 1, for estimating corresponding length parameter(s) and longitudinal position(s) of the one or more transversely localized electric current segments between the first and second electrically conductive bodies, the method comprising:

(A) with the electric current flowing through the first and second conductive bodies, measuring magnetic field components at two or more longitudinal positions using the one or more movable sensors;

(B) using the computer system, receiving signals from the one or more sensor actuators indicative of the longitudinal position(s) of one or more of the movable sensors along the sensing volume and signals from one or more of the movable sensors indicative of the corresponding measured magnetic field components; and (C) using the computer system, calculating corresponding estimated length parameter(s) and longitudinal position (s)s of the one or more current segments, that calculation being based at least in part on (i) magnetic field components measured at multiple different longitudinal positions along the sensing volume and (ii) for each of those measured magnetic field components, a corresponding longitudinal position along the sensing volume at which that magnetic field component was measured by a corresponding one of the one or more movable sensors.

* * * * *